(12) United States Patent
Gross et al.

(10) Patent No.: US 10,075,193 B2
(45) Date of Patent: Sep. 11, 2018

(54) METHODS AND SYSTEMS FOR DECODING POLAR CODES

(71) Applicant: THE ROYAL INSITUTION FOR THE ADVANCEMENT OF LEARNING/MCGILL UNIVERSITY, Montreal (CA)

(72) Inventors: Warren Gross, Cote-St-Luc (CA); Gabi Sarkis, San Diego, CA (US)

(73) Assignee: THE ROYAL INSTITUTION FOR THE ADVANCEMENT OF LEARNING/MCGILL UNIVERSITY, Montreal, Quebec ( * ) Notice: Subject to any disclaimer, the term of this patent is extended or adjusted under 35 U.S.C. 154(b) by 45 days.

(21) Appl. No.: 14/930,879

(22) Filed: Nov. 3, 2015

(65) Prior Publication Data
US 2016/0056843 A1    Feb. 25, 2016

Related U.S. Application Data

(62) Division of application No. 13/671,617, filed on Nov. 8, 2012, now Pat. No. 9,176,927.

(60) Provisional application No. 61/556,862, filed on Nov. 8, 2011, provisional application No. 61/639,150, filed on Apr. 27, 2012.

(51) Int. Cl.
| | | |
|---|---|---|
| *H03M 13/39* | (2006.01) |
| *G06F 17/10* | (2006.01) |
| *H03M 13/11* | (2006.01) |
| *H03M 13/13* | (2006.01) |
| *G06F 17/14* | (2006.01) |
| *G06F 17/16* | (2006.01) |
| *G06F 17/30* | (2006.01) |
| *H03M 13/15* | (2006.01) |
| *H03M 13/00* | (2006.01) |

(52) U.S. Cl.
CPC ........ *H03M 13/3927* (2013.01); *G06F 17/10* (2013.01); *G06F 17/142* (2013.01); *G06F 17/16* (2013.01); *G06F 17/30958* (2013.01); *G06F 17/30961* (2013.01); *H03M 13/1111* (2013.01); *H03M 13/1191* (2013.01); *H03M 13/13* (2013.01); *H03M 13/157* (2013.01); *H03M 13/1575* (2013.01); *H03M 13/617* (2013.01)

(58) Field of Classification Search
CPC .......... H03M 13/1111; H03M 13/1191; H03M 13/3927; G06F 17/30958; G06F 17/30961
See application file for complete search history.

(56) References Cited

U.S. PATENT DOCUMENTS

2013/0111291 A1* 5/2013 Ma ........................ H04L 1/0009
714/752

OTHER PUBLICATIONS

M. Davey and D. MacKay, "Low-density parity check codes over GF(q)," IEEE Commun. Lett., vol. 2, No. 6, pp. 165-167, 1998.
(Continued)

*Primary Examiner* — Curtis Odom
(74) *Attorney, Agent, or Firm* — Norton Rose Fulbright Canada LLP.

(57) ABSTRACT

Herein provided are methods and systems for decoding polar codes. A data flow graph relating to a predetermined polar code is converted to a tree graph comprising rate-zero nodes, rate-1 nodes, and rate-R nodes. A rate-R node within the binary tree is replaced with a maximum likelihood node when predetermined conditions are met thereby replacing a sub-tree of the tree graph with a single maximum likelihood node.

9 Claims, 13 Drawing Sheets

(56) References Cited

OTHER PUBLICATIONS

D. MacKay and M. Davey, "Evaluation of Gallager codes for short block length and high rate applications," in Proc. IMA Workshop Codes, Syst., Graphical Models, 1999.

A. Voicila, D. Declercq, F. Verdier, M. Fossorier, and P. Urard, "Low complexity decoding for non-binary LDPC codes in high order fields," IEEE Trans. Commun., vol. 58, No. 5, pp. 1365-1375, 2010.

G. Sarkis and W. J. Gross, "Reduced-latency stochastic decoding of LDPC codes over GF(q)," in Proc. European Wireless Conf. (EW), 2010, pp. 994-998.

C.-Y. Chen, Q. Huang, C.-C. Chao, and S. Lin, "Two low-complexity reliability-based message-passing algorithms for decoding non-binary LDPC codes," IEEE Trans. Commun., vol. 58, No. 11, pp. 3140-3147, 2010.

S. Pfletschinger, A. Mourad, E. Lopez, D. Declercq, and G. Bacci, "Performance evaluation of non-binary LDPC codes on wireless channels," in Proc. ICT Mobile Summit, 2009.

G. Sarkis, S. Hemati, S. Mannor, and W. J. Gross, "Relaxed halfstochastic decoding of LDPC codes over GF(q)," in Proc. 48th Annual Allerton Conf. Communication, Control, and Computing (Allerton), 2010, pp. 36-41.

D. Declercq and M. Fossorier, "Decoding algorithms for nonbinary LDPC codes over GF(q)," IEEE Trans. Commun., vol. 55, No. 4, pp. 633-643, 2007. [9]A. Leon-Garcia, Probability and Random Processes for Electrical Engineering, 2nd ed. Addison-Wesly, 1994.

E. Ankan, "Channel polarization: A method for constructing capacity-achieving codes for symmetric binary-input memoryless channels," IEEE Trans. Inf. Theory, vol. 55, No. 7, pp. 3051-3073, 2009.

C. Leroux, I. Tal, A. Vardy, and W. J. Gross, "Hardware architectures for successive cancellation decoding of polar codes," in Proc. IEEE Int Acoustics, Speech and Signal Processing (ICASSP) Conf, 2011, pp. 1665-1668.

C. Leroux, A. Raymond, G. Sarkis, and W. Gross, "A semi-parallel successive-cancellation decoder for polar codes," Signal Processing, IEEE Transactions on, vol. 61, No. 2, pp. 289-299, Jan. 15, 2013.

A. Alamdar-Yazdi and F. R. Kschischang, "A simplified successive cancellation decoder for polar codes," IEEE Commun. Lett., vol. 15, No. 12, pp. 1378-1380, 2011.

C. Zhang, B. Yuan, and K. K. Parhi, "Reduced-latency SC polar decoder architectures," in Proc. IEEE International Conference on Communications ICC '12, Jun. 10-15, 2012, pp. 1-5.

E. Ankan, "Systematic polar coding," IEEE Commun. Lett., vol. 15, No. 8, pp. 860-862, 2011.

I. Tal and A. Vardy, "How to construct polar codes," arXiv [cs.IT], May 2011. [Online]. Available: http://arxiv.org/abs/1105.6164.

\* cited by examiner

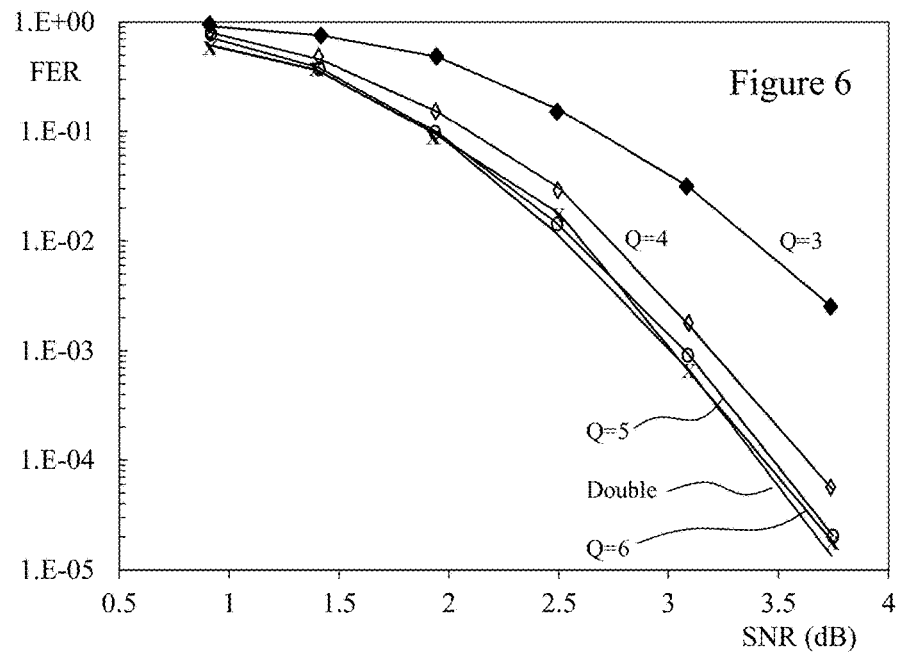
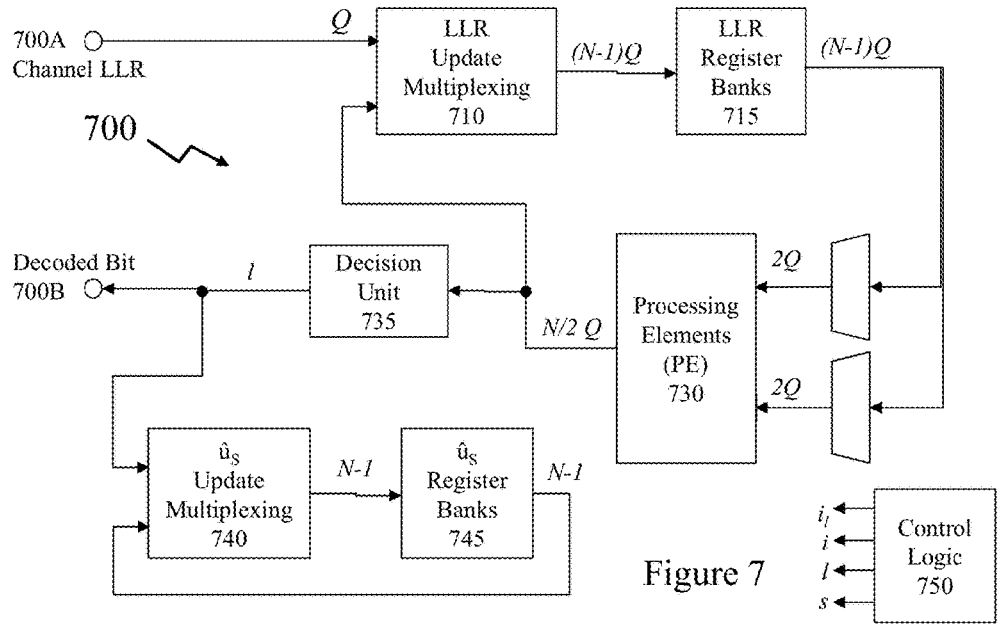

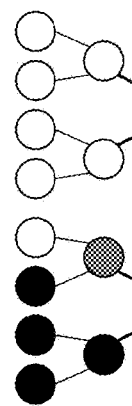 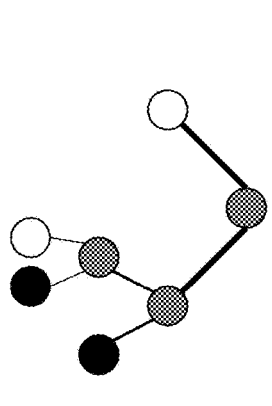 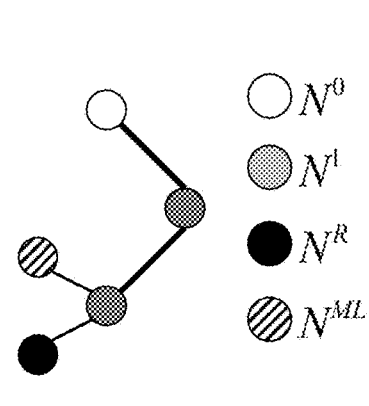
Figure 21A  Figure 21B  Figure 21C
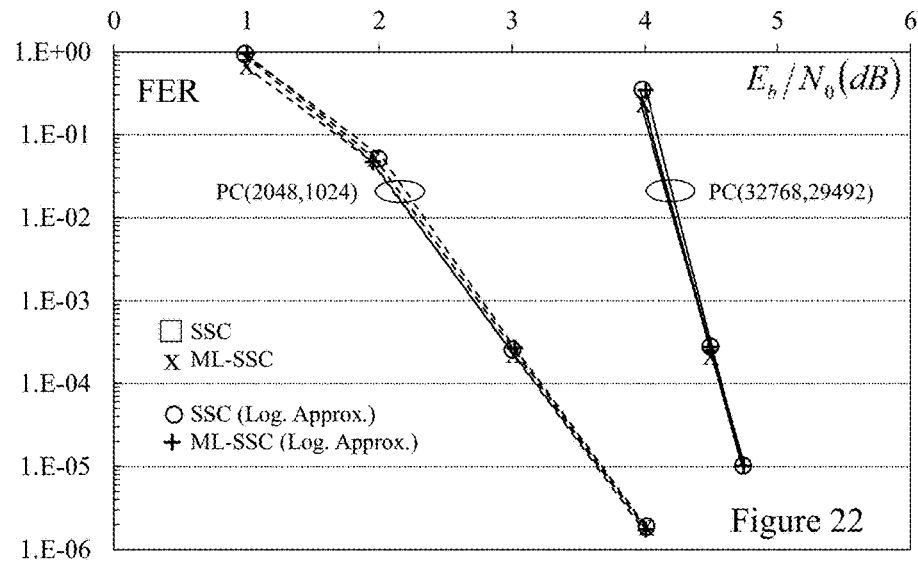
Figure 22

METHODS AND SYSTEMS FOR DECODING POLAR CODES

CROSS-REFERENCE TO RELATED APPLICATIONS

This application claims the benefit of priority as a divisional of U.S. Ser. No. 13/671,617 filed Nov. 8, 2012 entitled "Methods and Systems for Decoding Polar Codes" which itself claims priority from U.S. Provisional Patent Application Ser. No. 61/556,862 filed Nov. 8, 2011 entitled "Method and Device for the Decoding of Polar Codes" and U.S. Provisional Patent Application Ser. No. 61/639,150 filed Apr. 27, 2012 entitled "Semi-Parallel Architecture for Successive Cancellation Decoding of Polar Codes."

FIELD OF THE INVENTION

The present invention relates to polar codes and more specifically to implementing and improving the performance of decoders for polar codes.

BACKGROUND OF THE INVENTION

Two recurring central topics in information theory are efficient compression and reliable transmission of data. In the fast 20 years or so communications and information technologies have fundamentally changed how we access information, interact as a society, and communicate. Today, these central topics are everywhere in our daily lives whether they arise in our use of portable electronic devices for mobile communications, multimedia streaming/downloading, Internet access, etc or fixed electronic devices for content acquisition, watching our favorite television show, storing family photos, etc. Further, the ubiquitous nature of computing devices, cloud based storage, and the enhanced speed performance of the Internet mean that increasing our lives exploits remote stores of data.

With respect to data compression this can be either lossless or lossy. If the data consists of bank records, medical records, or personal details we cannot afford to lose any information. In such cases, the compression is achieved by exploiting patterns and redundancies in the data to reduce the volume of data that must be transferred. For example, the commonly used "zip" format for storing electronic data is a good example of a lossless compression scheme. In contrast, lossy compression involves loss of information and is commonly used for multimedia data like images, music or video. Common examples include the JPEG image format and the MP3 music format. So if we lose data why use lossy compression at all? On the one hand this is due to necessity as most physical phenomena are real valued and storing them in digital form must involve some form of quantization, and hence, some loss of information. On the other hand, a video captured in high-quality digital form can typically be compressed substantially with very little loss in perceptual quality to the viewer but significant reduction in memory storage requirements or transfer time from a remote source. Accordingly, between a given source and a measure of quality, there is a trade-off between storage requirement and quality. In many instances this trade-off can be exploited to adapt a source coding scheme to a given situation such that for example, a user with small bandwidth may be happy to get a low quality video if the alternative is not to be able to watch the video at all.

The second central topic of information theory is the transmission of data through a noisy medium. Typically, to make communication reliable in the presence of noise, redundancy in the data is added before transmission as the intended receiver only has access to a noisy version of the data. However, if the redundancy is added through coding then it is possible to reconstruct the original data at the receiver in the presence of noise, which results in incorrect data being received through decision making processes at the receiver. Coding is therefore a central and essential element in any communication systems we access ourselves or accessed in delivering the electronic content we seek to transmit and/or retrieve. However, adding this redundancy comes at the cost of reducing the effective rate of data transmission for a given data transmission rate as in addition to the data we must also transmit the redundant data.

In 1948, Shannon, "A Mathematical Theory of Communication" (Bell Sys. Tech. J., Vol. 27, pp 379-423), established the existence of a maximum rate, called the channel capacity, at which information can be reliably transmitted over a channel with noise, and the existence of codes which enable data transmission at that rate. Since then, different capacity-approaching codes have been created, see for example C. Berrou et al in "Near Shannon Limit Error-Correcting Coding and Decoding: Turbo-Codes" (Proc. ICC 93, Vol. 2, pp 1064-1070) and R. Gallager in "Low-Density Parity-Check Codes" (IRE Trans. Inf. Theory, Vol. 8, pp. 21-28). However, designing capacity-achieving codes with an explicit construction eluded researchers until Arikan proposed polar codes, see E. Arikan, "Channel Polarization: A Method for Constructing Capacity-Achieving Codes for Symmetric Binary-Input Memoryless Channels" (IEEE Trans. on Inf. Theory, Vol. 55, pp. 3051-3073), and proved that these polar codes asymptotically achieve the capacity of binary-input symmetric memoryless channels with increasing code length. Later works proved that polar codes achieve the channel capacity for any discrete memoryless channel and, by extension, for any continuous memoryless channel, see E. Sasoglu et al in "Polarization for Arbitrary Discrete Memoryless Channels" (Proc. IEEE Inf. Theory Workshop, 2009, pp. 144-148). Moreover, Arikan provided an explicit construction method for polar codes and showed that they can be efficiently encoded and decoded with complexity $O(N^*\log N)$, where N is the code length. Additionally, polar codes have also been shown to be beneficial in solving other information theoretic problems in an efficient manner, see for example H. Mahdavifar et al in "Achieving the Secrecy Capacity of Wiretap Channels Using Polar Codes" (IEEE Trans. on Inf. Theory, Vol. 57, pp. 6428-6443), N. Hussami et al in "Performance of Polar Codes for Channel and Source Coding" (IEEE ISIT 2009), and S. B. Korada et al in "Polar Codes are Optimal for Lossy Source Coding" (IEEE Trans. on Inf. Theory, Vol. 56, pp. 1751-1768).

However, whilst demonstrating these benefits, polar codes also require large code lengths to approach the capacity of the underlying channel, for example, $N > 2^{20}$, in which case, over 20 million computational nodes are required to decode one codeword. This presents a real challenge when it comes to implementing the decoders, for example successive cancellation (SC) decoders, in hardware. However, despite these large code lengths, polar codes beneficially have two desirable properties for hardware implementation. First, they are explicitly described in a recursive framework such that this regular structure enables resource sharing and simplification of the scheduling and the architecture. Second, unlike many common capacity-approaching codes, polar codes do not require any kind of randomness to achieve good error correcting performance which helps avoid memory conflicts and graph-routing problems during the implementation.

However, to date within the prior art research has been heavily focused to improving the error-correction performance of polar codes at moderate lengths and implementations such as Belief Propagation, see for example Hussami; Simplified Successive Cancellation, see for example A. Alamdar-Yazdi et al in "A simplified Successive Cancellation Decoder for Polar Codes" (IEEE Comm. Lett., Vol. 15, pp. 1378-1380); and Look-Ahead Technique, see for example C. Zhang et al in "Reduced-Latency SC Polar Decoder Architectures" (Proc. of IEEE Int. Conf. Comms., pp. 3520-3524, June 2012). These prior art approaches include list decoding, see for example I. Tal et al in "List Decoding of Polar Codes" (Proc. ISIT, 2011); non-binary polar codes, see for example R. Mori et al in "Non-Binary Polar Codes using Reed-Solomon Codes and Algebraic Geometry Codes" (Proc. IEEE Inf. Theory Workshop, 2010, pp 1-5); and complex construction methods, see for example S. B. Korada et al in "Polar Codes: Characterization of Exponent, Bounds, and Constructions" (IEEE Trans. Inf. Theory, Vol. 56, pp. 6253-6264). However, in contrast, the inventors have addressed implementing the standard SC decoding algorithm, as any improvements to such an SC decoding implementation can benefit more complex decoding algorithms since all polar codes are based on the same recursive construction. Beneficially, such low-complexity SC decoders implemented according to embodiments of the invention enable the use of longer polar codes and hence allow data to be transmitted over channels close to the channel capacity limit.

The original description of the SC decoding algorithm by Arikan mapped the decoder to a factor graph of the polar code, without going into any details of a specific architecture. Accordingly, the resulting SC decoder for the factor graph of Arikan includes $N*\log_2 N$ node processing elements (PEs), requires $N*\log_2 N$ memory elements (MEs), and takes $(2N-2)$ steps to decode one codeword. Accordingly it would be beneficial to address architectures and decoding processes that reduce the complexity of the SC decoder both in terms of the number of processing elements required, but also the number of memory elements and the number of steps required to decode a codeword.

It would be further beneficial if the complexity of the processing elements was reduced thereby allowing the die footprint of any implemented hardware circuit to be reduced thereby lowering cost. Similarly where large code lengths are employed a large number of memory elements are required with multiple read/write processes such that it would be beneficial for the structure and configuration of the memory to be improved to the decoder architecture. It would also be evident to one skilled in the art that in addition to reducing the number of elements that other factors impacting the overall performance of the decoder should also be addressed including, for example, latency. Beneficially, architectures and design methodologies established by the inventors address such issues whilst reducing overall complexity, as well as providing methodologies for adjusting decoder design based upon requirements including, but not limited to, cost (e.g. through die area) and speed (e.g. through latency, number of cycles, number of elements etc).

Other aspects and features of the present invention will become apparent to those ordinarily skilled in the art upon review of the following description of specific embodiments of the invention in conjunction with the accompanying figures.

SUMMARY OF THE INVENTION

It is an object of the present invention to mitigate drawbacks within the prior art relating to polar codes and more specifically to implementing and improving the performance of decoders for polar codes.

In accordance with an embodiment of the invention there is provided a method of decoding comprising:
providing an integer X processing elements, each processing element receiving two input values and generating an output in dependence upon at least the two input values;
providing integer Y first memories, each first memory receiving an output of a predetermined processing element;
providing the integer X processing elements and integer Y first memories in a predetermined configuration comprising at least an integer N of the plurality X processing elements in a first stage for receiving 2N likelihood ratios as inputs and a single processing element and a first memory in a final stage; and
providing a decision unit coupled to the output of the first memory in the last stage for generating an estimated bit based upon applying a predetermined decision making process to the output of the last stage of first memory.

In accordance with an embodiment of the invention there is provided a method of decoding;
providing an integer P processing elements, each processing element receiving a pair of input values and applying one of a first predetermined mathematical function and a second predetermined mathematical function in dependence upon a function control signal provided to the processing element to the pair of input values;
providing a first memory for storing at least one of the outputs from the integer P processing elements and a plurality of channel values relating to a received polar code to be decoded, the one of determined in dependence upon a clock cycle of a decoding process for the polar code currently being performed;
providing a second memory for storing indices of a plurality of frozen bits, each frozen bit representing a bit within the information-bit vector of the polar code being decoded for which a predetermined error probability has a predetermined magnitude;
providing a computation block coupled to the second memory receiving a plurality of inputs from the outputs of a predetermined portion of the processing elements and generating an output, the output being set to a predetermined frozen value if the current index of the bit being decoded is indicated as frozen within the second memory and set to a calculated value established in dependence upon a predetermined decision process applied to the plurality of inputs wherein the current index of the bit being decoded is indicated as not frozen.

In accordance with an embodiment of the invention there is provided a method of decoding comprising:
converting a data flow graph relating to a predetermined polar code to a tree graph comprising rate-zero nodes, rate-1 nodes, and rate-R nodes;
replacing a rate-R node within the binary tree with a maximum likelihood node when predetermined conditions are met thereby replacing a sub-tree of the tree graph with a single maximum likelihood node.

In accordance with an embodiment of the invention there is provided a device for decoding comprising:
an integer P processing elements, each processing element receiving a pair of input values and applying one of a first predetermined mathematical function and a second predetermined mathematical function in dependence upon a function control signal provided to the processing element to the pair of input values;

a first memory for storing at least one of the outputs from the integer P processing elements and a plurality of channel values relating to a received polar code to be decoded, the one of determined in dependence upon a clock cycle of a decoding process for the polar code currently being performed;

a second memory for storing indices of a plurality of frozen bits, each frozen bit representing a bit within the information-bit vector of the polar code being decoded for which a predetermined error probability has a predetermined magnitude;

a computation block coupled to the second memory receiving a plurality of inputs from the outputs of a predetermined portion of the processing elements and generating an output, the output being set to a predetermined frozen value if the current index of the bit being decoded is indicated as frozen within the second memory and set to a calculated value established in dependence upon a predetermined decision process applied to the plurality of inputs wherein the current index of the bit being decoded is indicated as not frozen.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 6 depicts simulated FER performance for a line decoder according to an embodiment of the invention with varying number of signal quantization bits;

FIG. 7 depicts an exemplary top-level architecture schematic of a line-coded SC decoder according to an embodiment of the invention;

FIGS. 21A and 21B depict decoder tree architectures for SC and SSC decoders according to the prior art for an (8,3) code;

FIG. 21C depicts a decoder tree architecture for an (8,3) code exploiting an ML-SSC decoder according to an embodiment of the invention;

FIG. 22 depicts FER performance for an ML-SSC decoder according to an embodiment of the invention compared to a prior art SSC decoder;

DETAILED DESCRIPTION

Figure 1A:
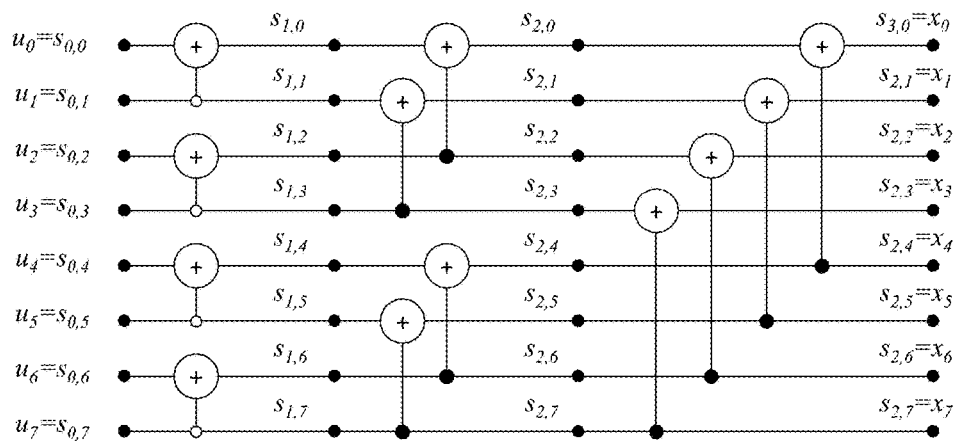
FIG. 1A depicts a data flow graph for a polar decoder of code length N=8.

The present invention is directed to polar codes and more specifically to implementing and improving the performance of decoders for polar codes.

The ensuing description provides exemplary embodiment(s) only, and is not intended to limit the scope, applicability or configuration of the disclosure. Rather, the ensuing description of the exemplary embodiment(s) will provide those skilled in the art with an enabling description for implementing an exemplary embodiment. It being understood that various changes may be made in the function and arrangement of elements without departing from the spirit and scope as set forth in the appended claims.

1: Polar Codes—A polar code is a linear block error-correcting code designed for a specific discrete-input, memoryless channel. Such codes may be used in forward error correction (FEC) and applied to transmitting data on a communications channel such that errors in the communication can be corrected and/or detected by the receiving circuit of a message block. Within the remainder of the specification, it is assumed that the channel is symmetric and has a binary input alphabet in order to align with the prior art of Gallager for low-density parity check (LDPC) codes which have been deployed in a variety of applications including IEEE 802.16e (WiMAX), IEEE 802.11n (Wi-Fi), DVB and DMB digital video broadcasting, and IEEE 802.3an 10 Gb/s Ethernet over twisted pair.

Letting $N=2^n$ be the code length, and $u=(u_0, u_1, \ldots, u_{N-1})$ and $x=(x_0, x_1, \ldots, x_{N-1})$, denote the input bits and the corresponding codeword, respectively. The encoding operation, depicted in FIG. 1A for N=8, has a butterfly structure similar to that of a fast Fourier transform (FFT). Accordingly, within this description the inventors refer to architectures that implement such encoding as butterfly-based decoders and the architecture as a butterfly-based architecture. It is important to note that the elements of vector u are presented to the butterfly-based encoder using a bit-reversed ordering, wherein the binary representation of their index is reversed.

The resulting codeword x, generated by encoding u, is sent over the communications channel through N distinct utilizations of the communications channel. The corresponding channel output is denoted by $y=(y_0, y_1, \ldots, y_{N-1})$. Decoding of this channel output y is performed by means of a successive cancellation (SC) decoder, where for a given y, the decoder sequentially attempts to deduce the value of $u_0$, then $u_1$, all the way to $u_{N-1}$. Accordingly, the decoding of $u_i$ is based on the prior estimation of $(u_0, u_1, \ldots, u_{i-1})$, denoted $(\hat{u}_0, \hat{u}_1, \ldots, \hat{u}_{i-1})$. The probability that y was received is denoted as $\Pr(y|\hat{u}_0^{i-1}, u_i=b)$ for $b \in \{0,1\}$, given that $u_0^{i-1} = \hat{u}_0^{i-1}$; $u_i=b$; and that $(u_{i+1}, u_{i+2}, \ldots, u_{N-1})$ are independent random variables with Bernoulli distribution of parameter 0.5. The estimated value $\hat{u}_i$ is chosen according to Equation (1) below.

$$\hat{u}_i = 0 \quad \text{if} \quad \frac{\Pr(y \mid \hat{u}_0^{i-1}, u_i = 0)}{\Pr(y \mid \hat{u}_0^{i-1}, u_i = 1)} \geq 1 \tag{1}$$

$$\hat{u}_i = 1 \quad \text{otherwise.}$$

As the code length N increases, the probability that a bit $u_i$ is correctly decoded, given that all previous bits were correctly decoded, approaches either 1 or 0.5, see Shannon. The proportion of bits whose probability of successful decoding approaches 1 tends towards the capacity of the underlying channel as N increases. This information regarding the reliability of those bits is used to select a high-reliability subset of u to store information bits, while the rest of u, called the frozen-bit set (or frozen set), is set to a fixed value. This value is assumed to be 0 within this specification. The frozen set is known by the decoder, which forces $\hat{u}_i$ to 0 if i is part of the frozen set, or calculates Equation (1) otherwise.

As noted supra polar codes are linear block codes of length $N=2^n$ where their generator matrix is constructed using the $n^{th}$ Kronecker power of the matrix F defined in Equation (1) below. For example, for n=3 the resulting generator matrix is defined in Equation (2). This being true for as long as architectures do not utilize bit reversal techniques.

$$F = \begin{bmatrix} 1 & 0 \\ 1 & 1 \end{bmatrix} \tag{1}$$

$$F^{\otimes 3} = \begin{bmatrix} 1 & 0 & 0 & 0 & 0 & 0 & 0 & 0 \\ 1 & 1 & 0 & 0 & 0 & 0 & 0 & 0 \\ 1 & 0 & 1 & 0 & 0 & 0 & 0 & 0 \\ 1 & 1 & 1 & 1 & 0 & 0 & 0 & 0 \\ 1 & 0 & 0 & 0 & 1 & 0 & 0 & 0 \\ 1 & 1 & 0 & 0 & 1 & 1 & 0 & 0 \\ 1 & 0 & 1 & 0 & 1 & 0 & 1 & 0 \\ 1 & 1 & 1 & 1 & 1 & 1 & 1 & 1 \end{bmatrix} \tag{2}$$

The equivalent graph representation of $F^{\otimes 3}$ is illustrated in FIG. 1A, where $u=u_0^7$ represents the information-bit vector and $x=x_0^7$ is the codeword sent over the channel. These vector notations being the same as those of Arikan in that $u_a^b$ consists of bits $u_a, \ldots, u_b$ of the vector u. When the received vectors are decoded using a Successive Cancellation (SC) decoder, every estimated bit $\hat{u}_i$ has a predetermined error probability given that bits $u_0^{i-1}$ were correctly decoded, that tends towards either 0 or 0.5. Moreover, the proportion of estimated bits with a low error probability tends towards the capacity of the underlying channel, as proved in Arikan. Polar codes exploit this phenomenon, called channel polarization, by using the most reliable K bits to transmit information, while setting, or freezing, the remaining (N−K) bits to a predetermined value, such as 0.

1A: Successive Cancellation Decoding of Polar Codes—Given a received vector y corresponding to a transmitted codeword x, an SC decoder successively estimates the transmitted bits $u_0$ to $u_{N-1}$. At step i, if i is not in the frozen set, then the SC decoder estimates $\hat{u}_i$ according to Equations (3A) and (3B) below.

$$\hat{u}_i = 0 \quad \text{if} \quad \frac{\Pr(y, \hat{u}_0^{i-1} \mid u_i = 0)}{\Pr(y, \hat{u}_0^{i-1} \mid u_i = 0)} > 1 \tag{2A}$$

$$\hat{u}_i = 1 \quad \text{otherwise} \tag{2B}$$

where $\Pr(y, \hat{u}_o^{i-1}|u_i=b)$ is the probability that y was received and the previously decoded bits are $\hat{u}_0^{i-1}$, given the currently decoded bit is b, where $b \in \{0,1\}$. The ratio of probabilities in Equations (2A) and (2B) represents the likelihood ratio (LR) of bit $\hat{u}_i$.

Figure 1B:
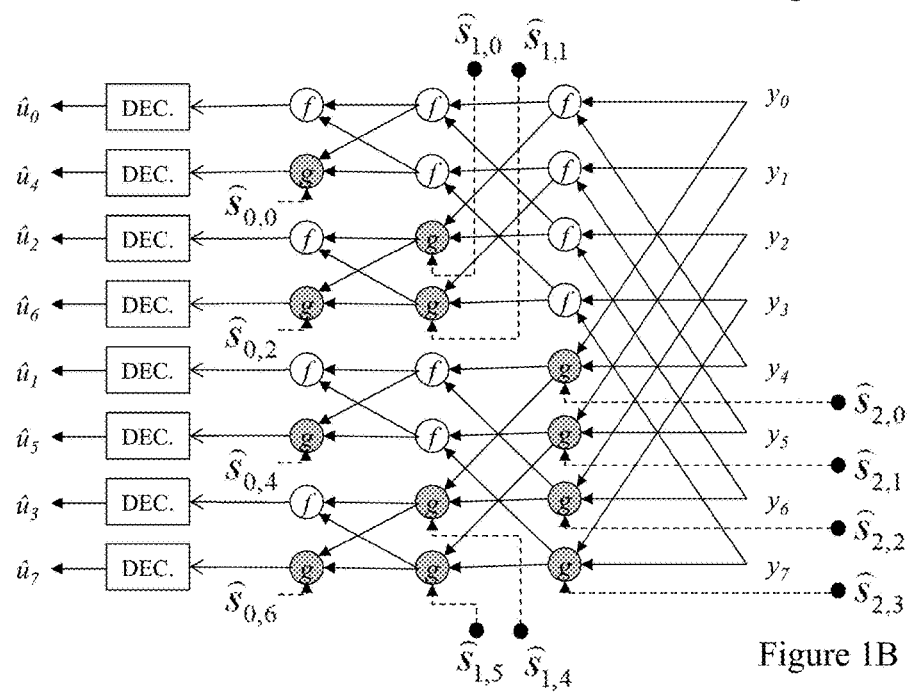
FIG. 1B depicts a butterfly based SC decoder according to the architecture implementing a factor graph of Arikan according to the prior art for N=8.

1B: Successive Cancellation Decoding Scheduling of Polar Codes—The successive cancellation (SC) decoding algorithm successively evaluates the LR $L_i$ of each bit $\hat{u}_i$. Arikan showed that these LR computations can be efficiently performed in a recursive manner by using a data flow graph which resembles the structure of a fast Fourier transform. That structure, shown in FIG. 1B, is named a butterfly based decoder. Messages passed in the decoder are LR values denoted as $L_{l,i}$ where l and i correspond to the graph stage index and row index, respectively. In addition, $L_{0,i}=L(\hat{u}_i)$ and $L_{n,i}$ is the LR directly calculated from the channel output $y_i$. The nodes in the decoder graph calculate the messages using one of two functions, f and g, respectively as defined in Equations (3A) and (3B) respectively $$L_{l,i}=f(L_{l+1,i};L_{l+1,i+2^l}) \text{ if } B(l,i)=0 \tag{3A}$$

$$L_{l,i}=g(\hat{s}_{l,i-2^l};L_{l+1,i-2^l};L_{l+1,i}) \text{ if } B(l,i)=1 \tag{3B}$$

where $\hat{s}$ is a modulo-2 partial sum of decoded bits, $$B(l,i) \triangleq \frac{i}{2^l}$$

mod 2, 0≤l≤n, and (0≤i≤N). In the LR domain, these functions f and g can be expressed as Equations (4) and (5) below.

$$f(a,b) = \frac{1+ab}{a+b} \quad (4)$$

$$g(\hat{s},a,b) = a^{1-2\hat{s}}b \quad (5)$$

Figure 2:
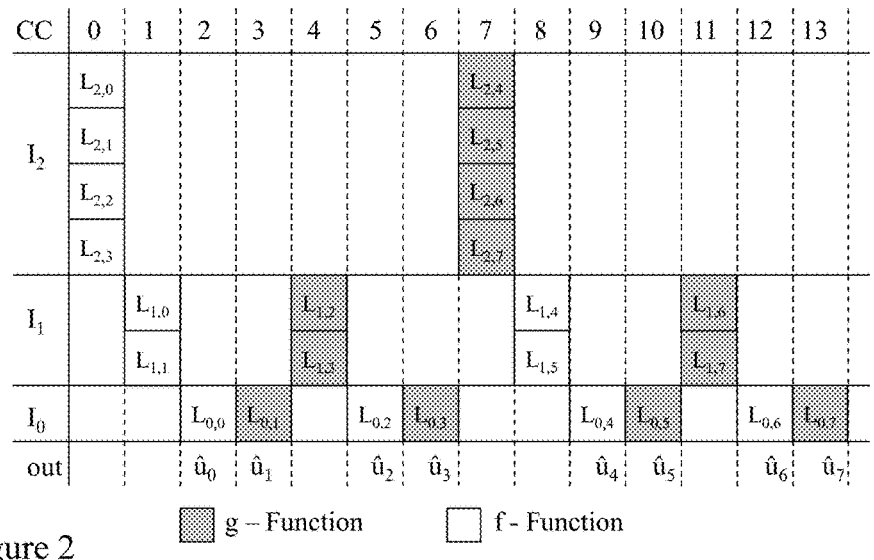
FIG. 2 depicts scheduling of processing within a prior art butterfly based SC decoder with N=8 according to the prior art of Arikan.

Function f can be computed as soon as $a=L_{l+1,i}$ and $b=L_{l+1,i-2^l}$ are available. On the other hand, the computation of g requires knowledge of ŝ, which can be computed by using the factor graph of the code. For instance, in FIG. 1B, $\hat{s}_{2,1}$ estimated by propagating $\hat{u}_0^3$ in the factor graph $\hat{s}_{2,1}=\hat{u}_1 \oplus \hat{u}_3$. This partial sum of $\hat{u}_0^3$ is then used to compute $L_{2,5}=g(\hat{s}_{2,1};L_{3,1};L_{3,5})$ The need for partial sum computations causes strong data dependencies in the SC algorithm and constrains the order in which the LRs can be computed in the graph. FIG. 2 shows the scheduling of the decoding process for N=8 using a prior art butterfly-based SC decoder according to the prior art of Arikan. At each clock cycle (CC), LRs are evaluated by computing function f or g. It is assumed here that those functions are calculated as soon as the required data is available. Once the channel information $y_0^{N-1}$ is available on the right hand side of the decoder, bits $\hat{u}_i$ are successively estimated by updating the appropriate nodes of the graph, from right to left. When bit $\hat{u}_i$ is estimated, all partial sums involving $\hat{u}_i$ are updated, allowing future evaluations of function g to be carried out.

1C: Prior Art SC Decoder Architecture—The Butterfly—Arikan showed that SC decoding can be efficiently implemented by the factor graph of the code. As noted supra we refer to this decoder architecture as the butterfly architecture or butterfly-based SC decoder. It is assumed that channel likelihood ratios (LRs) $\lambda_i$ presented to the right hand side of the graph whereas the estimated bits $\hat{u}_i$ appear on the opposite end. As depicted, the SC decoder of the prior art is composed of $n=\log_2 N$ stages, each containing N nodes. Accordingly for a code of $N=2^{20}$ an SC decoder of the prior art would comprise 20 stages each of 1,048,576 nodes. Clearly such a large number of nodes to implement an SC decoder approaching the channel capacity limit of a communication channel results in a complex and expensive decoder circuit.

We refer to a specific node as $N_{l,i}$ where l designates the stage index (0≤l≤n) and i, the node index within the stage l (0≤i≤N). Each node within the SC decoder according to the prior art updates its output according to one of the two following update rules, depicted in FIG. 1B as first process element nodes employing a first update rule f and second process element nodes employing a second update rule g. These update rules are defined by Equations (6) and (7) below.

$$f(a,b) = \frac{1+ab}{a+b} \quad (6)$$

$$g(\hat{u}_s,a,b) = a^{1-2\hat{u}_s}b \quad (7)$$

The association of specific nodes within the SC decoder according to the prior art as either f or g nodes being evident from FIG. 2 wherein in the first stage these alternate and then are grouped with groupings defined by the stage number. In both Equations (6) and (7) the values a and b are likelihood ratios (LR) while $\hat{u}_s$ is a bit representing a modulo-2 partial sum of previously estimated bits. For example, in node $N_{1,3}$, this partial sum is $\hat{u}_s=\hat{u}_4\oplus\hat{u}_5$. The value of $\hat{u}_s$ determines if function g should perform a multiplication or a division. These update rules are complex to implement in hardware since they involve multiplications and divisions. Accordingly, the inventors have developed an architecture so that these operations for the g function are performed in the logarithmic domain, thereby substantially reducing the hardware implementation complexity, and to approximate the function f.

Additionally, the inventors have addressed the sequential nature of the algorithm which introduces data dependencies in the decoding process. Accordingly, for example, $N_{1,2}$ cannot be updated before bit $\hat{u}_1$ is computed and, therefore, neither before $\hat{u}_0$ is known. In order to respect the data dependencies, a decoding schedule has to be defined. Arikan proposed two such schedules for this decoding framework. In the left-to-right schedule, nodes recursively call their predecessors until an updated node is reached. The recursive nature of this decoding schedule is especially suitable for a software implementation. In the alternative right-to-left schedule, a node updates its value whenever its inputs are available. Each bit $\hat{u}_i$ is successively estimated by activating the spanning tree rooted at $N_{0,\pi(i)}$, where π(i) denotes the bit-reverse mapping function.

Accordingly, referring to FIG. 2, the decoder tree structure for an SC decoder according to the teachings of Arikan is depicted with the spanning tree associated with $\hat{u}_0$ is highlighted. Accordingly, it can be seen that this requires processing of all channel LRs $\lambda_1, \ldots, \lambda_7$ and 4 PEs in the third stage ($N_{2,1};N_{2,3};N_{2,5};N_{2,7}$); 2 PEs in the second stage ($N_{1,0};N_{1,4}$); and a single PE in the third stage ($N_{0,0}$) of the tree structure. However, the inventors have determined that if they place memory elements (MEs), for example registers or SRAM blocks, between each stage or, equivalently, that each node processor within the PE can store its updated value, then some results can be re-used. For example, considering bit $\hat{u}_1$ in FIG. 2, then with such MEs in place this can be decoded by only activating $N_{0,4}$ since $N_{1,0}$ and $N_{1,4}$ have already been updated during the decoding of $\hat{u}_0$. Despite the well-defined structure and decoding schedule of the butterfly-based decoder presented by Arikan there is no consideration of the implementation issues of resource sharing, memory management or control generation required for a hardware implementation. Arikan's framework suggests unlimited computation resources. However, the methodology described above from the inventors suggests that it could be implemented with $N \log_2 N$ combinational node processors combined with N registers between each stage, to store the intermediate results. In order to store the channel information, N extra registers are included as well. The overall complexity of such a decoder is given by Equation (8) below.

$$C_{butterfly}=(C_{np}+C_r)N\log_2 N+NC_r \quad (8)$$

where $C_{np}$ and $C_r$ represent the hardware complexity of a node processor and a memory register, respectively. In order to decode one vector, each stage l has to be activated (2n−1) times. Accordingly, if we assume that one stage is activated at each clock cycle, then the number of clock cycles required to decode one vector is given by Equation (9) below.

$$\Im_{butterfly} = \sum_{l=0}^{n-1} 2^{n-l} = 2N - 2 \quad (9)$$

The throughput, in bits per second, is therefore given by Equation (10).

$$T_{butterfly} = \frac{N}{\Im_{butterfly} \times t_{np}} \approx \frac{1}{2t_{np}} \quad (10)$$

where $t_{np}$ is the propagation time in seconds through a node processor, which also corresponds to the clock period. It follows that every node processor is actually used only once every (2N−2) clock cycles. Accordingly, the inventors have factored this into their analysis in modifying the butterfly architecture of Arikan by merging several nodes of the decoding graph into a single PE. Based upon the assumptions made by the inventors the resulting tree architectures that can be implemented with reduced number of PEs yielding what are termed pipelined tree and line architectures.

2: Reduced Complexity Successive Cancellation Decoder Architectures

2A: Pipelined Tree Architecture—As noted supra every node processor is actually used only once every (2N−2) clock cycles. However, analysing the decoding schedule further reveals that whenever a given stage l is activated, only 2l nodes are actually updated. For example, referring to FIG. 2, when stage 0 is enabled, only one node is updated and as such the N nodes of stage 0 can be implemented using a single processing element (PE). However, this resource sharing does not necessarily guarantee that the memory assigned to the merged nodes can also be merged.

Referring to Table 1 below shows the stage activations occurring during the decoding of one vector y. Within Table 1 which function (f or g) applied to the 2l active nodes of each stage $S_l$, for each clock cycle (CC) is shown. Each generated variable is used twice during the decoding process. For example, the four variables generated in stage 2 at CC=1 are consumed on CC=2 and CC=5 in stage 1. This means that, in stage 2, the four registers associated with function f can be re-used at CC=8 to store the four data values generated by function g.

TABLE 1

Decoding Schedule for Prior Art Butterfly and Pipeline SC Architectures for N = 8

| CC | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| $S_2$ | f | | | | | | | g | | | | | | |
| $S_1$ | | f | | | g | | | | f | | | g | | |
| $S_0$ | | | f | g | | f | g | | | f | g | | f | g |
| $\hat{u}_i$ | | | $\hat{u}_0$ | $\hat{u}_1$ | | $\hat{u}_2$ | $\hat{u}_3$ | | | $\hat{u}_4$ | $\hat{u}_5$ | | $\hat{u}_6$ | $\hat{u}_7$ |

Figure 3:
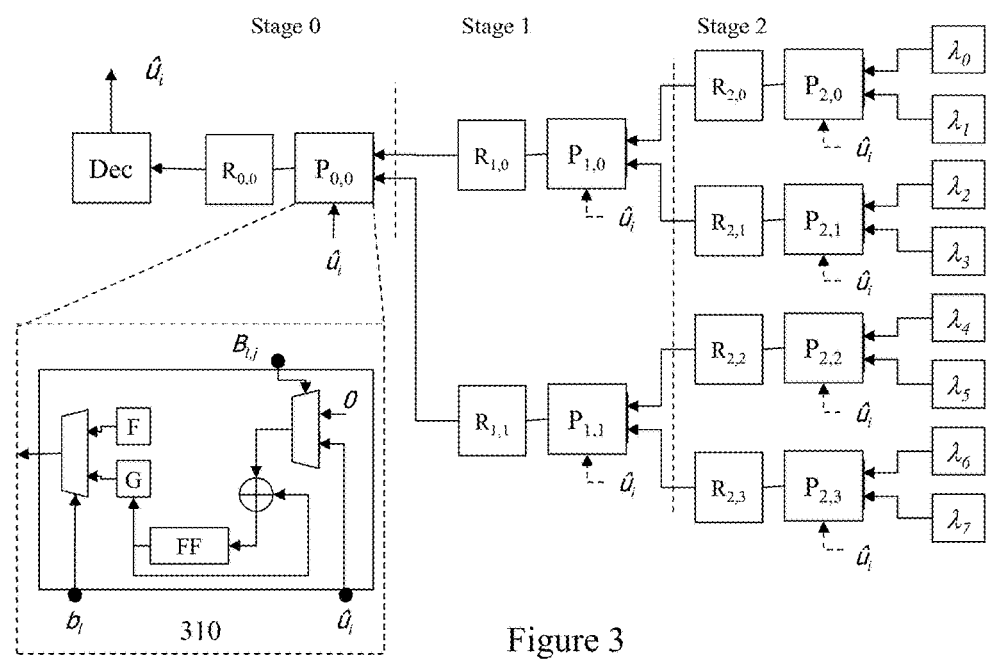
FIG. 3 depicts a pipelined SC decoder architecture according to an embodiment of the invention for N=8.

This process according to embodiments of the invention may be applied to all stages of the decoder thereby yielding a pipelined architecture according to an embodiment of the invention as depicted in FIG. 3 for N=8. The channel LRs, $\lambda_1$, are stored in N registers. The remainder of the decoder is composed of a pipelined tree structure that includes N−1 PEs, denoted $P_{l,i}$, and N−1 registers, denoted $R_{l,i}$; where $0 \le l \le n-1$ and $0 \le i \le 2l-1$. A decision unit at the output of Stage 0 generates the estimated bit $\hat{u}_i$ which is then broadcast back to every PE. According to an embodiment of the invention a PE 310 is a configurable element so that it can perform either of the required f or g functions according to the requirements of the current cycle. It also includes the $\hat{u}_s$ computation block that updates the $\hat{u}_s$ value with the last decoded bit $\hat{u}_i$ only if the control bit$_{l,i}$=1. Another control bit $b_l$ is used to select whether the PE function is f or g.

Accordingly, compared to the butterfly-based structure of the prior art, the pipelined tree architecture according to embodiments of the invention performs the same amount of computation using the same decoding schedule, see Table 1, but with a smaller number of PEs and registers. The throughput is thus the same as that given in Equation (10) but importantly the decoder has a lower hardware complexity as given by Equation (11) below.

$$C_{butterfly} = (N-1)(C_{PE} + C_r) + NC_r \quad (11)$$

where $C_{PE}$ represents the complexity of a single PE. In addition to the lower complexity, it would be evident that the routing network of the pipeline decoder according to embodiments of the invention is much simpler in tree architecture than that of the butterfly-based structure. Further connections between PEs are also local thereby reducing the risk of congestion during the wire routing phase of an integrated circuit design and potentially increasing the clock frequency and accordingly the throughput of the decoder.

Figure 4:
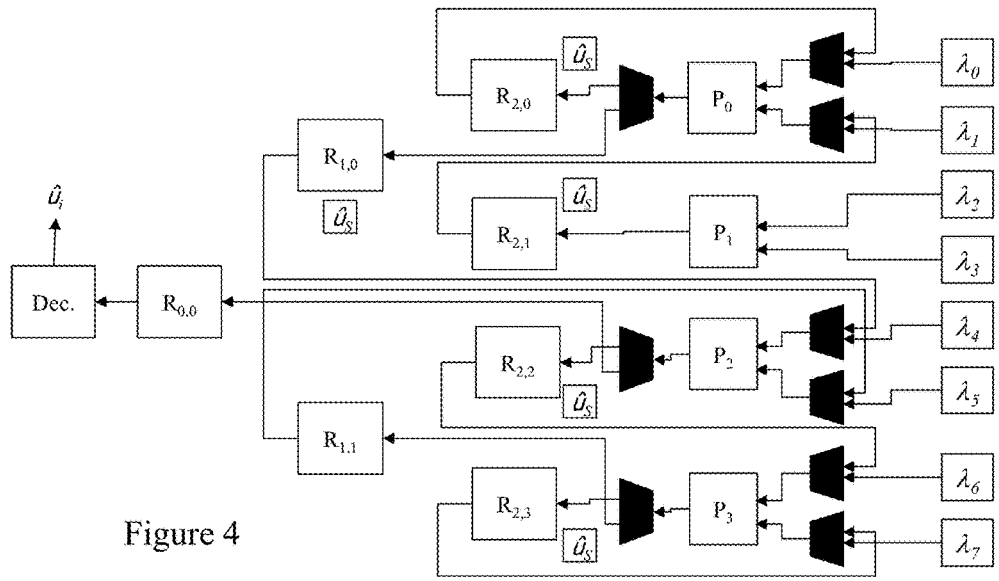
FIG. 4 depicts a line-coded SC decoder architecture according to an embodiment of the invention for N=8.

2B: Line Architecture—Despite the reduced complexity of the pipelined tree architecture according to embodiments of the invention, the inventors have established that it is possible to further reduce the number of PEs. Further analysis of Table 1, indicates that only one stage is active at any given time, i.e. clock cycle. In the worst case, stage n−1, (N/2) PEs are required simultaneously. Accordingly, the same throughput may be achieved with only (N/2) PEs such as depicted in FIG. 4 with line SC architecture according to an embodiment of the invention for N=8. Accordingly, the PEs $P_i$ are arranged in a line, whilst the registers $R_{l,i}$ retain a tree structure emulated by multiplexing resources connecting the two.

For example, since $P_{2,0}$ and $P_{1,0}$ within the pipeline architecture, FIG. 3, are merged into $P_0$ of the line architecture, FIG. 4, $P_2$ should write either to $R_{2,0}$ or $R_{1,0}$; and it should also read from the channel registers or from $R_{2,0}$ and $R_{2,1}$. The $\hat{u}_s$ computation block is, as a result of the line architecture, moved out of $P_i$ and is now close to the associated register because $\hat{u}_s$ should also be forwarded to the PE. Accordingly, the overall complexity of the line SC architecture is given by Equation (12) below.

$$C_{line} = (N-1)(C_r + C_{\hat{u}_s}) + \frac{N}{2}C_{PE} + \left(\frac{N}{2} - 1\right)3C_{max} + NC_r \quad (12)$$

where $C_{max}$ represents the complexity of a 2-input multiplexer and $C_{\hat{u}_s}$ is the complexity of the $\hat{u}_s$ computation block.

Despite the extra multiplexing logic required to route the data through the PE line of the line SC architecture, the reduced number of PEs makes this line SC decoder lower complexity than the pipelined tree architecture. The impact of multiplexer stages on the critical path is analyzed below in Section 3C.1 ASIC Synthesis Results. The control logic required for the line SC architecture is not included in the complexity estimation since it is negligible compared to processing elements and the memory elements as evident from the analysis in Section 3C.1 ASIC Synthesis Results.

2C: Vector Overlapped SC Decoder—Within the preceding analysis relating to the tree architecture implementation of the SC decoder it was shown that there are multiple stages of the tree decoder that are idle during clock cycles. Accordingly, it is therefore possible to utilize these idle stages of the tree decoder to decode multiple received vectors simultaneously as data relating to different vectors may be processed within the tree decoder within different stage in a single clock cycle. The inventors showed, see C. Leroux et al in "Hardware Architectures for Successive Cancellation Decoding of Polar Codes" (Proc. IEEE Int. Acoustics, Speech and Signal Processing (ICASSP) Conf. 2011, pp. 1665-1668), that this decoding scheme may yield an increased utilization rate of the decoder. Leroux showed that a vector overlapped decoding scheme achieves a utilization rate as given by Equation (13).

$$a_{vector} \approx \frac{V\log_2 N}{4N + (2V + 2)\log_2\left(\frac{V+1}{4}\right)} \quad (13)$$

where V represents the number of overlapped vectors processed in the decoder. However, whilst this architecture provides an improved utilization rate it also requires that the memory be duplicated V times in order to store the multiple vectors for subsequent extraction when the next processing element stage is available for a vector. However, as discussed below in respect of Section 3C.1: ASIC Synthesis Results if the memory is implemented using registers then a single memory set for a reduced complexity line architecture already accounts for nearly 50% of the die footprint. Accordingly, as V increases the semiconductor die footprint is increasingly dominated by memory elements rather than processing elements and their associated routing to/from the PEs such that the vector overlapped decoder becomes impractical when V>>1.

Considering a pipeline decoder according to an embodiment of the invention then the utilization rate of this is given by Equation (13)

$$a_{tree} = \frac{N\log_2 N}{2(N-1)(2N-2)} \approx \frac{\log_2 N}{4N} \quad (14)$$

This improves the utilization rate over the butterfly based decoder of Arikan by a factor of $$\frac{\log_2 N}{2}.$$

In contrast a line architecture SC decoder according to an embodiment of the invention provides an equivalent utilization rate is given by Equation (15).

$$a_{line} = \frac{N\log_2 N}{N(2N-2)} \approx \frac{\log_2 N}{2N} \quad (15)$$

2D: Likelihood Determination: SC decoding was originally proposed in the likelihood ratio domain, which requires that the update rules f and g exploit multiplication and division processes. However, the hardware cost of implementing these operations is high and accordingly they are usually avoided in practice wherever feasible. Accordingly, the inventors have adapted the architecture to perform SC decoding in the logarithmic domain in order to reduce the complexity of the f and g computation blocks within the hardware implementation. Based upon the channel information being available as log-likelihood ratios (LLRs) $L_i$, which leads to the following alternative representation for equations f and g according to an embodiment of the invention as defined in Equations (16) and (17).

$$f(L_a, L_b) = 2\tanh^{-1}\left(\tanh\left(\frac{L_a}{2}\right)\tanh\left(\frac{L_b}{2}\right)\right) \quad (16)$$

$$g(\hat{u}_s, L_a, L_b) = L_a(-1)^{\hat{u}_s} + L_b \quad (17)$$

Within the terms of a hardware implementation, g may be mapped to an adder-subtractor controlled by bit $\hat{u}_s$. However, f involves some transcendental functions that are complex to implement in hardware, i.e. tanh and $\tanh^{-1}$. Comparison of the alternative representations of f and g with update rules employed in BP decoding of LPDC codes shows similarities such that approximations from such BP decoders may be applied resulting in the f approximation defined by Equation (18) and g determination in Equation (19) respectively.

$$f(L_a, L_b) \approx \text{sign}(L_a)\text{sign}(L_b)\min(|L_a|,|L_b|) \quad (18)$$

$$g(\hat{u}_s, L_a, L_b) = L_a(-1)^{\hat{u}_s} + L_b \quad (19)$$

Figure 5:
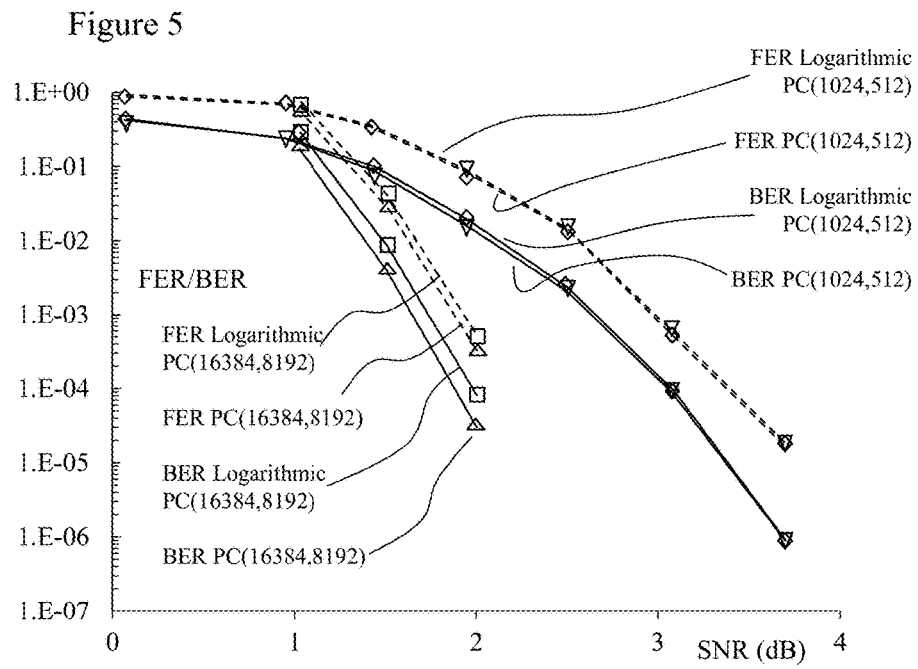
FIG. 5 depicts error-correction performance of logarithmic based update rules according to an embodiment of the invention with signal-to-noise ratio for different code lengths.

In order to estimate the performance degradation incurred by exploiting an approximation for the f update rule simulations were performed for different polar codes on an additive white-Gaussian (AWGN) channel with binary phase-shift keying (BPSK). The resulting simulation results are depicted in FIG. 5 indicating that the resulting performance degradation from this approximation is minor for moderate-length codes and is very small (0.1 dB) for longer codes. Accordingly, an f update rule approximation may be applied without impacting performance of the polar code SC decoder but improving the hardware implementation.

3: Reduced Complexity Line Decoder Hardware Implementations

Within the preceding analysis undertaken by the inventors it can be seen that the line architecture has a lower hardware complexity than the pipeline architecture, and that both of these architectures are more efficient in hardware than the prior art tree-based architectures. Accordingly, the design and synthesis of a line architecture implementation are presented below based upon the design principles described supra by the inventors in respect of embodiments of the invention. This section presents details and synthesis results of an implementation of the line architecture.

3A: Fixed-Point Simulations—The number of quantization bits used in calculations impacts not only the decoding performance of the algorithm but also the hardware complexity of the decoder. Consequently, the inventors have analysed using a software based SC decoder these tradeoffs to determine where tradeoffs performance and complexity offer increased benefit. The resulting simulations revealed that fixed-point operations on a limited number of quantization bits attained a decoding performance very similar to that of a floating point algorithm. Referring to FIG. 6 there are depicted simulation results for a PC(1024,512) decoder wherein it can be seen that 5 or 6 bits of quantization are sufficient to reach near-floating point performance at a saturation level of ±3σ, which exhibits good performance over all quantization levels. Assuming an additive white Gaussian noise (AWGN) channel, σ represents the variance of the noise. It should be noted that the channel saturation level has a high impact on the performance of low-quantization (Q={3, 4}) decoders. The selected saturation value (±3σ) was chosen from further software simulations, which are not presented here.

3B: Detailed Hardware Architecture—Within the following sections the various components of a hardware implementation of a line architecture SC decoder (LASD) 700 for polar codes are presented according to an embodiment of the invention depicted schematically in FIG. 7.

3B.1: Processing Elements (PEs) 730—The processing element (PE) 730 is the main arithmetic component of the LASD 700 and other line SC decoders according to other embodiments of the invention. It embodies the arithmetic logic required to perform both update rule functions f and g within a single logic component. This grouping of both functions into a common PE 730 is motivated within the line architecture by the fact that all stages of the decoding graph for the line architecture may perform either of the f and g functions at any time during the clock cycles. Accordingly, increased resource sharing between the PEs 730 also implements the likelihood approximation described supra, which allows for much simpler decoding logic, as it replaces three transcendental functions with a single comparator. Since the PEs are replicated N/2 times, as evident from Equation (8) then this approximation has a significant impact on the overall size of the decoder.

Figure 8:
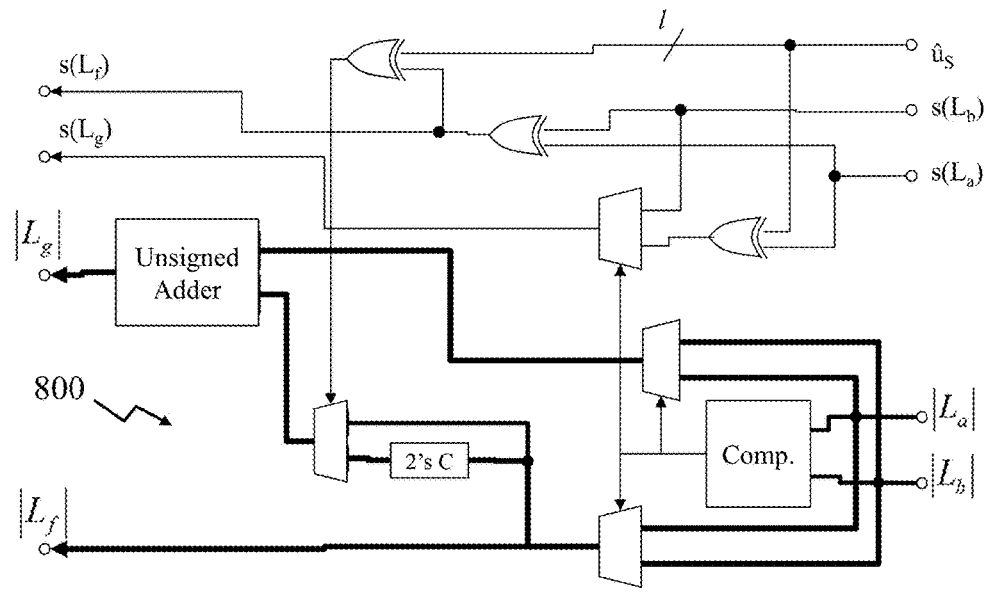
FIG. 8 depicts an exemplary architecture for a processing element according to an embodiment of the invention.

Within some embodiments of the invention the PEs 730 are fully combinational and operate on quantized sign-and-magnitude (SM) coded LLRs. Optionally, the PEs may be also implemented with other designs, such as for example two's complement format, although logic synthesis indicates that SM coded LLSRs show a significant area reduction. Indeed, referring to Equations (11) and (12) then it can see that the principal operations performed on the LLRs are addition, subtraction, absolute value, sign retrieval, and minimum value, all of which are very-low-complexity operations in the SM format. Referring to FIG. 8 there is depicted an architectural schematic of an SM-based PE 800 according to an embodiment of the invention. In FIG. 8 inputs $L_a$ and $L_b$ are the two Q-bit input LLRs of functions f and g and the partial sum signal input $\hat{u}_s$ controls the behavior of SM-based PE 800. Sign, s(·), and magnitude |·| data of the input LLRs are directly extracted and the comparator is shared for the computation of $|L_f|$, $|L_g|$ and $s(L_g)$. Within SM-based PE 800 the thick lines represent magnitude data paths (e.g. for $|L_f|$, $|L_g|$ and the thin lines represent sign data paths.

3B.2: Register Banks—As discussed supra memory resources are required within pipeline and line SC decoder architectures in order to store the temporary computations during the decoding process. According to an embodiment of the invention this memory is implemented using register banks The decoder contains two such register banks, a first register bank 715 for storing the partial LLR calculations and a second register bank 745 for storing the partial sums $\hat{u}_s$. Within each of the first and second register banks 715 and 745 respectively the memory elements are arranged according to an embodiment of the invention in a tree structure similar to that shown in FIG. 3 for the pipelined tree architecture.

Accordingly, the LLR register bank, first register bank 715, uses (2N−1) Q-bit registers to store LLRs whilst the partial sum register bank, second register bank 745, uses (N−1) 1-bit registers (i.e. flip-flops) to store the partial sums $\hat{u}_s$ used to implement function g. The LLRs banks can be viewed as ($\log_2 N+1$) separate register lines, one for each stage of the architecture, with each stage l requiring 2l Q-bit registers. Stage ($\log_2 N+1$) is different in that it contains the received channel LLRs, thereby requiring shift-register capabilities. It would also be evident that for the architectures according to embodiments of the invention each stage produces half as much data as it consumes. This data is written into the register locations within a stage l and is read by the subsequent stage l−1. The partial sum bank, on the other hand, combines the $N \log_2 N$ partial sums of the decoding graph into (N−1) flip-flops by time-multiplexing each flip-flop for use by multiple nodes of the graph.

3B.3: Multiplexing—The shared nature of the PEs used in the line architecture implies a need for multiplexing resources at their inputs and outputs. As discussed in the preceding section on Register Banks and illustrated in FIG. 7 the memory within line architecture SC decoders according to such embodiments of the invention are implemented using registers. From there, separate networks of multiplexers and demultiplexers are responsible for providing the PEs with the appropriate inputs from the required register locations, and storing the PE outputs to the right location within the registers, respectively.

Alternatively, line architecture based SC decoders according to other embodiments of the invention may exploit Static Random Access Memory (SRAM) blocks, in which case the multiplexing networks, depicted as $\hat{u}_s$ Update Multiplexing 740 and LLR Update Multiplexing 710, may be removed as the equivalent logic functions are typically directly embodied in the memory decoder of the SRAM modules. This would allow for a further reduction in complexity and lead to a more compact memory block, although there may be an increase in access time. Other embodiments of the invention may exploit a combination of SRAM and registers to yielding a potentially further improved optimization as referring to Table 1, it appears that some of the memory elements are accessed more often than others. Accordingly, it may be more efficient to implement these frequently-accessed memory elements using registers while storing less frequently accessed data within in the SRAM blocks.

The improved performance of line architecture SC decoders employing either solely registers, solely SRAM, or SRAM/register combinations varies with code lengths and hence different architecture implementations are expected to offer improved performance against the other designs as the code length varies. Within the descriptions of embodiments of the invention within this specification and their implementation/performance the work targeted primarily moderate-length codes and accordingly hardware implementations relied solely on registers. As evident in FIG. 7 within the LASD 700 the LLR Update Multiplexing 710 is connected to both the PEs 730 and the Channel LLR input 700A. Likewise the outputs of the PEs are connected via a Decision Unit 735 to Decoded Bit output 700B. The output of the Decision Unit 735 is also coupled to the $\hat{u}_s$ Update Multiplexing 740.

3B.4: General Control—A line architecture SC decoder is a multi-stage design which sequentially decodes each codeword. Typically specific control signals, for example binary-coded integers are stored in little-endian format, are employed to orchestrate the decoding. Such control signals are combinational functions of i, the current decoded bit number, and l, the current stage wherein these two signals are in turn generated using counters and some extra logic, this being depicted generically as Control Logic 750. The underlying understanding is that up to $\log_2 N$ stages must be activated in sequence to decode each bit $\hat{u}_i$. Once it has been decoded, this bit is stored in specific partial sums $\hat{u}_s$, used for decoding subsequent bits according to the data dependencies highlighted previously.

Both i, the current decoded bit number, and l, the current stage, can be viewed as counters wherein i counts up from 0 to N−1 for each decoded bit, whilst l counts down to 0. However, unlike i, the initial value of l is not fixed and changes with respect to i. This follows from the fact that not all stages need to be activated to decode each bit. By making use of the partial computations stored in the LLR register banks, only those stages producing new data are activated. Accordingly, l is reset to ffs*(i+1), a modified find-first-bit-set operation, upon reaching 0, according to the rules described below in Equations (20A) and (20B).

$$ffs*(x_{n-1} \ldots x_1 x_0) = \min(i): x_i = 1 \quad \text{if } x > 0 \quad (20A)$$
$$= n - 1 \quad \text{if } x = 0 \quad (20B)$$

As derived in Equation (5) the decoding of a codeword takes (2N−2) clock cycles overall. Another control signal deals with the function that the PEs 730 must perform on behalf of a specific stage. Since the nodes of a given stage all perform the same function at any given time, this signal can be used to control all the PEs 730 of the line simultaneously. The function selection is performed using Equations (21A) and (21B) respectively.

$$selector_{f,g}(i_{n-1} \ldots i_1 i_0, l) = f \quad \text{if } i_l = 0 \quad (21A)$$
$$= g \quad \text{if } i_l = 1 \quad (21B)$$

3B.5: Memory Control—The LLR and the partial sum ($\hat{u}_s$) register banks, first and second register banks 715 and 745 respectively, for the line architecture SC decoder require significant multiplexing resources to route the proper values both from the memories to the PEs 730, and vice versa. The multiplexer network mapping for the inputs of the PEs 730 to the LLR register banks, first register bank 715, uses the mapping defined by Equations (22A) and (22B).

$$MAG_{LLR}^{REG \to PE}(l, P) = REG_{LLR}(2N - 2^{l+2} + 2P) \text{ for } L_a \quad (22A)$$
$$= REG_{LLR}(2N - 2^{l+2} + 2P + 1) \text{ for } L_b \quad (22B)$$

where $0 \leq P \leq (N/2-1)$ is the index of the PE 730 in the line architecture. This mapping is based upon the assumption that the original codeword is stored in register locations $REG_{LLR}(0:N-1)$. The resulting computation is then stored according to the mapping shown in Equation (23). It should be noted that only the first $2^l$ PEs 730 of the line are active in stage l.

$$MAG_{LLR}^{REG \to PE}(l,P) = REG_{LLR}(2N - 2^{l-1} + P) \quad (23)$$

Once stage 0 has been activated, the output of $PE_0$ contains the LLR of the decoded bit i, and a hard decision $\hat{u}_i$ can be obtained from this soft output using Equation (1), in other words, if sign(LLR)=0. At this point, if bit i is known to be a frozen bit, the output of the decoder is forced to $\hat{u}_i = 0$. Once bit $\hat{u}_i$ has been decoded, this value must be reflected in the partial (modulo-2) sums $\hat{u}_s$ of the decoding graph. Based upon review of the original decoding graph the inventors note that it contains $$\frac{N}{2} \log_2 N$$

such partial sums, but that only a maximum of (N−1) partial sums are used for the decoding of any given bit. Accordingly, the inventors have established that with by exploiting an appropriate time-multiplexing sequence it is possible to reduce the number of flip-flops used to hold those partial sums to only (N−1). This is a clear reduction in complexity and represents the approach exploited within the embodiments of the invention described within this portion of the specification. The mapping defined by Equation (24) connects the partial sum input of $PE_P$ to the partial sums register bank, second register bank 745.

$$MAG_{LLR}^{REG \hat{u}S \to PE_P}(l,P) = REG_{\hat{u}_S}(2N - 2^{l+1} + P) \quad (24)$$

It would be evident to one skilled in the art that these mapping equations may be efficiently implemented using combinational logic.

3C: Verification—Verification of the hardware design for the line architecture SC decoder was carried out by means of functional simulation. Specifically, a test bench was devised to exercise the decoder using $10^3$ to $10^6$ randomly-generated noisy input vectors, depending on the code length N. The output of the simulated hardware decoder was then compared to its software counterpart, whose error-correction capabilities had previously been verified experimentally. This validation was repeated for various combinations of signal-to-noise ratio (SNR) and code lengths to ensure good test coverage.

3C.1: ASIC Synthesis Results—In order to evaluate the silicon footprint of the line architecture based SC decoder for polar codes, a generic register-transfer level (RTL) description of the architecture was designed, and synthesized using a standard cell library. This generic description enabled the inventors to generate specific line decoder instances for any code length N, code rate R, target signal-to-noise ratio SNR, and quantization level Q. Syntheses were carried out to measure the impact of these parameters on decoder die area, using Cadence RTL Compiler and the Taiwan Semiconductor Manufacturing Company (TSMC) 65 nm CMOS standard-cell library (worst-case, with nominal supply voltage and temperature of $V_{dd}$=0.9V and T=125° C. respectively). Synthesis was driven by Physical Layout Estimators (PLE), which allow a more accurate estimation of interconnection delays and area, compared to the classical wire-load model. The target frequency was set to 500 MHz.

Figure 9:
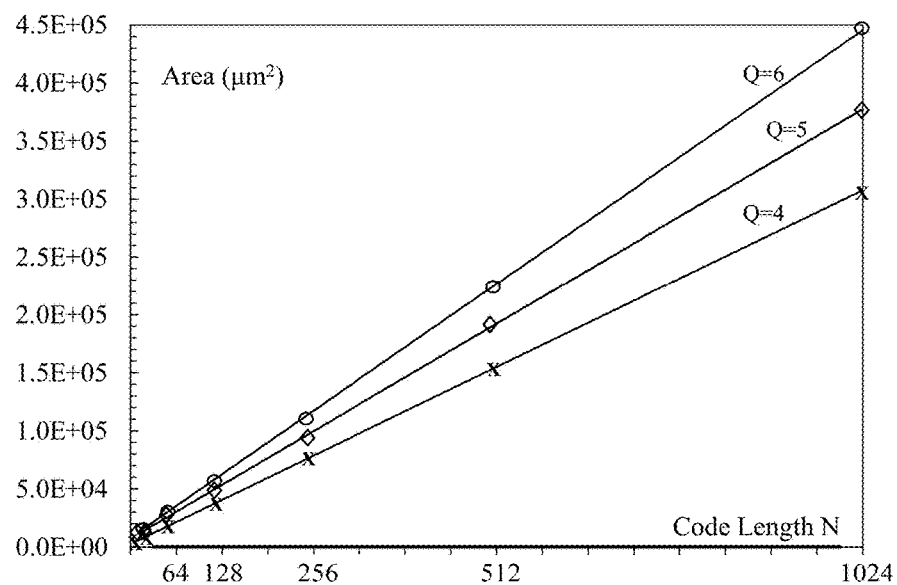
FIG. 9 depicts modeled decoder die footprint with varying quantization and code length for a 65 nm silicon process for line-coded SC decoders according to an embodiment of the invention.

A first set of decoders was generated for $8 \leq N \leq 1024$ and $4 \leq Q \leq 6$. Referring to FIG. 9 there is presented the evolution of the decoder die area as a function of these code sizes for the various quantization levels. It is evident from this analysis that the decoder die area grows linearly with N and Q. This linear variation of decoder die area (hardware complexity) validates Equation (8). Subsequently a second set of decoders were generated and synthesized for N=1024 with different codes rates. These synthesis results confirmed that the code rate does not impact decoder die area (hardware complexity). This was expected because the frozen bits are stored in a read-only memory (ROM) whose size is constant and only its contents change according to the code rate and target SNR.

Finally, a set of decoders was generated for N=1024 and Q=5. The decoder die area of each component block was extracted in order to estimate their relative complexity share inside the decoder overall. The results of this analysis are shown in Table 2 below. From these it is evident that memory resources, in these hardware designs these are registers and the PEs take significant portions of the decoder area overall at 44% and 33% respectively. Accordingly, these represent approximately 75% of the line architecture decoder die area alone. The multiplexing resources represent half of the complexity of the PEs. The pipeline tree decoder has not been implemented in hardware designs explicitly by the inventors. However, we can approximate its complexity using Table 2. Compared to the line decoder, the pipeline tree decoder is composed of the same number of registers, twice the number of PEs, has no multiplexing resources, and has the same decision unit and a very similar control unit.

Factoring those estimations into the gate counts reported in Table 2, we can approximate the total complexity of the pipeline tree decoder complexity to be approximately 120% of that of the line decoder wherein both are implemented according to the design guidelines discussed supra in respect of embodiments of the invention. In terms of timing analysis, the critical path of the line decoder includes extra multiplexing stages. Timing reports of logic synthesis at f=500 MHz indicates that the propagation time through the multiplexing layer represents 15% of the critical path in the line decoder overall, and accordingly the throughput penalty is therefore limited.

TABLE 2

Line Architecture Decoder Die Area
(TSMC 65 nm, f = 500 MHz, Q = 5)

| Module | Area ($\mu m^2$) | Gate Count | Area (%) |
| --- | --- | --- | --- |
| Reg. (LLR + $\hat{u}_S$) | 162,143 | 112,600 | 44 |
| Processing Element | 118,848 | 82,533 | 33 |
| MUX (LLR + $\hat{u}_S$) | 54,072 | 37,550 | 15 |
| Decision Unit | 29,380 | 20,402 | 8 |
| Controller | 467 | 324 | 0.1 |
| Total | 364,910 | 253,409 | 100 |

4. Improved Utilization Successive Cancellation Decoder Architectures

4A: Scheduling Principles—The architectures presented supra in respect of in Section 2 Reduced Complexity Successive Cancellation Decoder Architectures whilst providing improvements over the prior art tree architecture of Arikan still exhibit the same characteristic with respect to their utilization rate as the tree architecture in that this decreases as the code length increases. Whilst the pipelined and line architectures are more efficient in terms of hardware design requirements and semiconductor die footprint, and the vector-overlap architecture enhances utilization at expense of additional memory requirements, they still scale in utilization rate, $\alpha$, at rates of $\log_2 N/4N$, $\log_2 N/2N$, and $\log_2 N/4N$ (for fixed V) respectively. Accordingly, the inventors have established a methodology of improving the utilization rate, $\alpha$, based upon limiting the number of PEs implemented in the decoder.

Analysis of the line architecture SC decoder shows that the N/2 PEs are all activated simultaneously only twice during the decoding of a vector, regardless of the code size. Accordingly, the inventors determined that an increase of the utilization rate of a decoder can be obtained by reducing the number of PEs implemented without significantly impacting the decoder throughput. For example, a modified line SC decoder according to an embodiment of the invention implemented with only N/4 PEs will only incur a 2 clock cycle penalty compared to a full line decoder according to another embodiment of the invention. Within the remainder of this specification we refer to such simplified modified line architectures as a semi-parallel SC (SPSC) decoder. Such SPSC decoders have a lower complexity at the expense of a small increase in latency.

Figure 10:
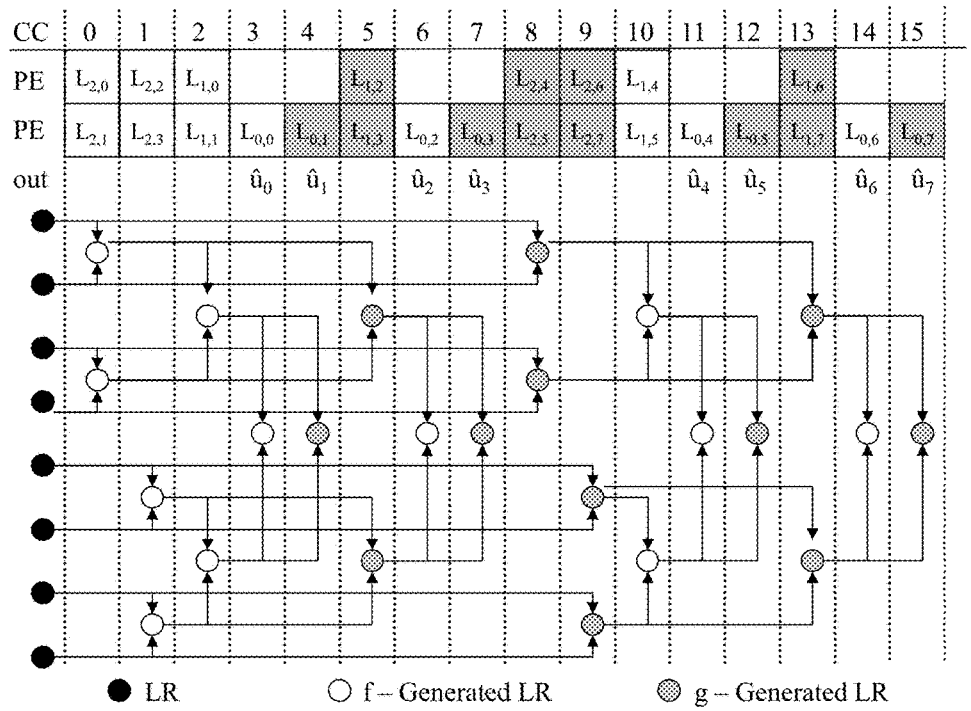
FIG. 10 depicts scheduling of processing within a semi-parallel SC decoder according to an embodiment of the invention for N=8 with 2 processing elements (P=2)

According to embodiments of the invention this approach can be generalized to a smaller number of PEs wherein we define a parameter P<(N/2) as the number of implemented PEs. Referring to FIG. 10 there is depicted a scheduling table that describes the scheduling of a SPSC decoder with {P=2;N=8}, where it can be observed that this scheduling only requires 2 additional clock cycles over the equivalent line architecture decoder but with half the PEs of the equivalent line architecture decoder. Indeed, the computations performed during clock cycles {0,1} and {8,9} are executed in a single clock cycle in a line architecture decoder according to an embodiment of the invention. Additionally FIG. 10 a data flow graph for the LRs generated during the decoding process with a SPSC decoder according to an embodiment of the invention for {P=2;N=8}. Accordingly, it is evident that data generated during CC={0,1} is not required after CC=5 and can therefore be replaced by the data generated in CC={8,9}. It follows, therefore, that the same memory element can be used to store the results of both computations providing a further reduction in decoder complexity and die requirements.

Further, the memory requirements remain unchanged in comparison with the line decoder as the number of implemented PEs varies. The SPSC decoder requires N MEs for the channel information y, and (N−1) MEs for intermediate results. Consequently, for a code of length N, the memory requirements of the SPSC decoder remain constant regardless of the number of implemented PEs. It should be noted that the data dependencies involving ŝ are not represented in FIG. 10 and therefore, even though it may seem that the data generated at CC={8,9} could have been produced earlier, this is not the case as the value of $\hat{u}_3$ must be known in order to compute $L_{2,4}$; $L_{2,5}$; $L_{2,6}$ and $L_{2,7}$ respectively.

4B: Complexity versus Latency—Although the reduced number of processing elements implemented in a SPSC decoder increases latency, this reduction only affects the processing of stages that require more than the P node updates. Starting from this general observation, the impact of reducing the number of processing elements on latency can be quantified. In order to keep some regularity in the scheduling, the inventors have assumed that the number of implemented PEs, P, is a power of 2, i.e. $P=2^p$ but it would be evident to one skilled in the art that the number of implemented PEs may be established at other values provided that the overall condition P<(N/2).

Within a line SC decoder according to an embodiment of the invention, every stage l of the graph is updated $2^{n-1}$ and, it is assumed, takes a single clock cycle to perform those updates since a sufficient number of PEs is implemented. However, in a SPSC decoder according to an embodiment of the invention, a limited number of PEs is implemented and it may take several clock cycles to complete a stage update. The stages satisfying $2^l \leq P$ are not affected and their latency is unchanged. However, for stages requiring more LR computations than there are implemented PEs, it takes multiple clock cycles to complete the update. Specifically, ($2^l/P$) clock cycles are required to update a stage 1 with P implemented PEs. Therefore, the total latency of a SPSC decoder ($\Im_{SPSC}$) according to an embodiment of the invention is given by Equation (25A) below wherein the first term represents the latency of the non-affected stages and the second term represents the latency of the affected stages, wherein each represents the number of clock cycles required to execute.

$$\Im_{SPSC} = \sum_{l=0}^{P} 2^{n-1} + \sum_{l=p+1}^{n-1} 2^{n-1} 2^{l-p} \tag{25A}$$

$$\Im_{SPSC} = 2N\left(1 - \frac{1}{2P}\right) + (n - p - 1)\frac{N}{P} \tag{25B}$$

$$\Im_{SPSC} = 2N + \frac{N}{P}\log_2\left(\frac{N}{4P}\right) \tag{25C}$$

This latency is calculated in Equations (25B) and (25C) respectively. As expected, the latency of the SPSC decoder according to an embodiment of the invention increases as the number of implemented PEs decreases. However, this latency penalty is not linear with respect to P. In order to quantify the trade-off between the latency of the SPSC decoder ($\Im_{SPSC}$) and P, we define the relative-speed factor ($\sigma_{SP}$) of a SPSC decoder according to an embodiment of the invention by Equation (26A) below.

$$\sigma_{SP} = \frac{\Im_{REF}}{\Im_{SPSC}} = \frac{2P}{2P + \log_2\left(\frac{N}{4P}\right)} \tag{26A}$$

where $\Im_{REF}$ is defined by Equation (26B) below.

$$\Im_{REF} = \sum_{l=0}^{n-1} 2^{n-l} = 2N - 2 \tag{26B}$$

Hence, $\sigma_{SP}$, defines the throughput attainable by the SPSC decoder according to an embodiment of the invention, relative to that of the line decoder according to another embodiment of the invention. The definition of $\sigma_{SP}$ within this specification implicitly assumes that both decoders can be clocked at the same frequency, i.e. $Freq_{clk-line}=Freq_{clk-SPSC}$ and hence $T_{clk-line}=T_{clk-SPSC}$. However, as discussed below in respect of Section 4D Hardware Implementation, synthesis results of the SPSC and line decoders according to embodiments of the invention show that due to the large number of PEs in the line decoder, that it is more likely that $Freq_{clk-line}<Freq_{clk-SPSC}$ and hence $T_{clk-line}>T_{clk-SPSC}$. Accordingly, Equation (26A) represents the least favorable case for the SPSC decoder architecture relative to the line decoder architecture. The utilization rate of a SPSC decoder according to an embodiment of the invention is defined by Equation (27).

$$\alpha_{SP} = \frac{N\log_2 N}{2P\left(2N + \frac{N}{P}\log_2\left(\frac{N}{4P}\right)\right)} = \frac{\log_2 N}{4P + 2\log_2\left(\frac{N}{4P}\right)} \tag{27}$$

Figure 11:
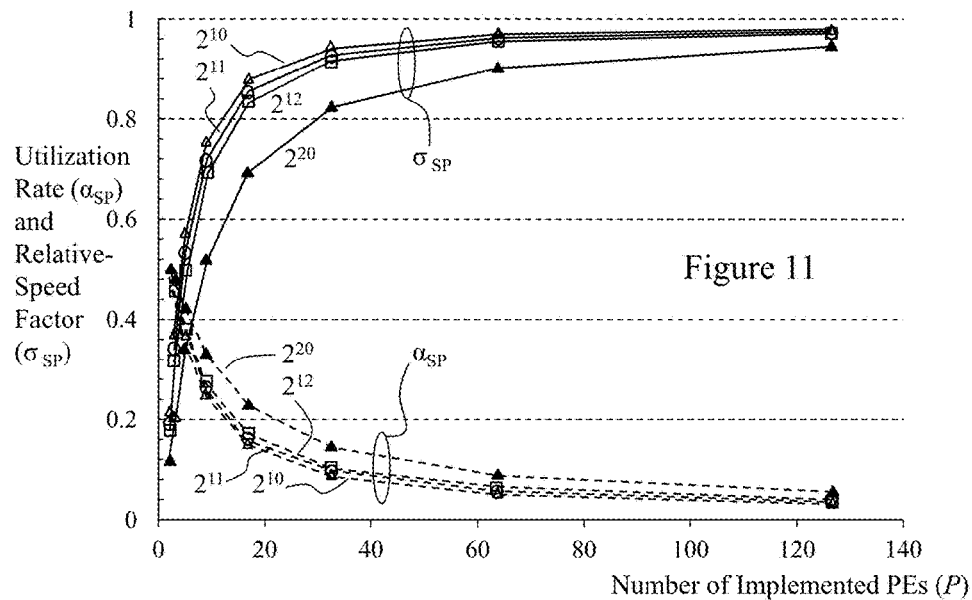
FIG. 11 depicts utilization rate and relative-speed factor for semi-parallel SC decoders according to embodiments of the invention with varying number, P, of processing elements.

Now referring to FIG. 11 plots for $\sigma_{SP}$ and $\alpha_{SP}$ as P is varied from 1 to 128 for code lengths $N=\{2^{10}, 2^{11}, 2^{12}, 2^{20}\}$ are presented. It is evident from these that both of these metrics vary marginally with respect to code length for a given number of PEs. Further, it is also evident that these curves show that $\sigma_{SP}$ is close to 1 (one) even for small values of P. Accordingly, a small number of PEs within an SPSC decoder according to embodiments of the invention are sufficient to achieve a throughput similar to that of a line SC decoder according to an embodiment of the invention. For example, the SPSC decoders according to embodiments of the invention for which the results are presented in FIG. 11 can achieve >90% of the throughput of a line SC decoder according to an embodiment of the invention when using only 64 PEs. Accordingly, the number of PEs is reduced by a factor (N/2P), which is 8192 for $N=2^{20}$ and P=64. For P=64 and N=1024, the utilization rate ($\alpha_{SP}=3.5\%$) is improved by a factor of 8 compared to the line SC decoder according to an embodiment of the invention. Accordingly, it would be evident to one skilled in the art that this demonstrates a more efficient use of processing resources during the decoding process. Further, this complexity reduction makes the size of the processing resources required very small in comparison to that of the memory resources required by this architecture, as discussed in Section 4D Hardware Implementation.

Figure 12:
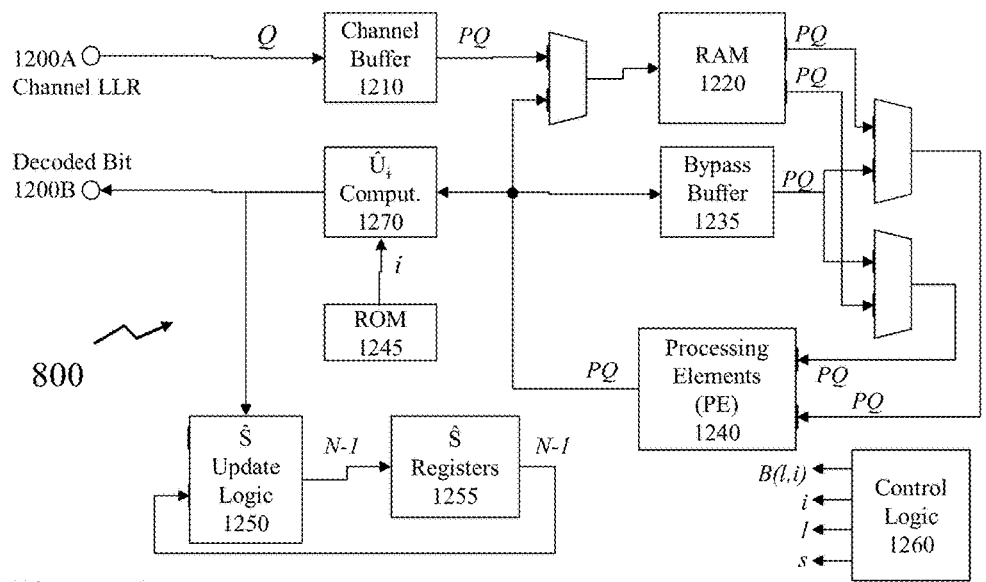
FIG. 12 depicts an exemplary semi-parallel SC decoder architecture according to an embodiment of the invention.

4C: SPSC Decoder Hardware Architecture—As with Section 3B Detailed Hardware Architecture for the line SC decoders according to embodiments of the invention this section addresses a hardware architecture implementation for a SPSC encoder according to an embodiment of the invention. This discussion being made with respect to the top level architecture, SPSC 1200, depicted in FIG. 12.

4C.1: Processing Elements 1240—As discussed supra SC polar code decoders carry out their likelihood estimations (LRs) using update rules (6) and (7). However, as noted with the line SC encoder hardware architecture these equations require divisions and multiplications, which makes them unsuitable for a hardware implementation and accordingly the inventors in order to reduce complexity, see Leroux, suggested replacing these LR updates with equivalent functions in the logarithmic domain. Accordingly, in the hardware architecture described within this specification the inventors have maintained the log likelihood ratio (LLR) methodology for the SPSC decoders according to embodiments of the invention. The notation employed being $\lambda_X=\log(X)$, where X is an LR and $\lambda_X$ its corresponding LLR. Accordingly, the LLR domain functions f and g become those described by Equations (28A) and (28B) respectively which are mathematically equivalent to those presented in Equations (16) and (17) but presented using the notational references for SPSC decoders of $\lambda_X$ rather than $L_X$.

$$\lambda_f(\lambda_a, \lambda_b) = 2\tanh^{-1}\left(\tanh\left(\frac{\lambda_a}{2}\right)\tanh\left(\frac{\lambda_b}{2}\right)\right) \tag{28A}$$

$$\lambda_g(\hat{s}, \lambda_a, \lambda_b) = \lambda_a(-1)^{\hat{s}} + \lambda_b \tag{28B}$$

At discussed supra whilst Equation (28A) may appear more complex than the generation of its LR counterpart in Equation (6) as it involves hyperbolic functions these may be approximated resulting in the approximation given by Equation (29).

$$\lambda_f(\lambda_a, \lambda_b) \approx \psi^*(\lambda_a)\psi^*(\lambda_b)\min(|\lambda_a|, |\lambda_b|) \tag{29}$$

where $\psi^*(X)$ denotes the sign of the variable X and accordingly in agreement with the rule established for the line architecture decoder $\psi^*(X)=1$ for $X\geq 0$ and $\psi^*(X)=-1$ otherwise.

Figure 13:
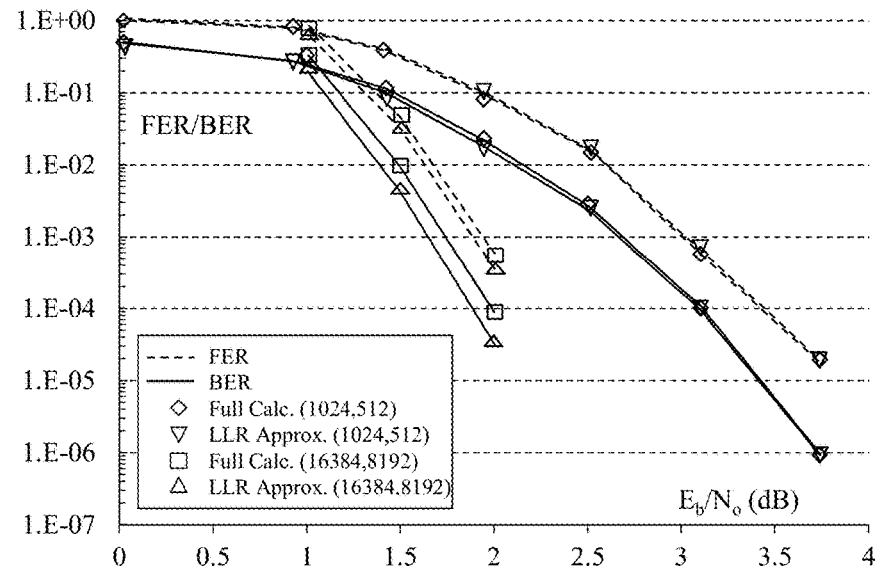
FIG. 13 depicts FER/BER performance of semi-parallel SC decoders according to an embodiment of the invention for different code lengths.

Equations (29) and (28B) suggest therefore a simple hardware implementation. Referring to FIG. 13 the Bit-Error Rate (BER) and Frame Erasure Rate (FER) with and without the LLR approximations being implemented on an AWGN channel for $N=2^{10}$ and $N=2^{14}$. Accordingly, the inventors have not only adopted this likelihood approximation but as discussed supra have also merged $\lambda_f$ and $\lambda_g$ into a single PE as described supra in respect of the line architecture decoder such that sign and magnitude (SM) for the f function are defined by Equations (30A) and (30B) respectively.

$$\psi(\lambda_f)=\psi(\lambda_a)\oplus\psi(\lambda_a) \qquad (30A)$$

$$|\lambda_f|=\min(|\lambda_a|,|\lambda_b|) \qquad (30B)$$

where $\psi(X)$, like $\psi^*(X)$, describes the sign of variable X and likewise is "1" for zero and positive values of X and "−1" for negative values of X.

Figure 14:
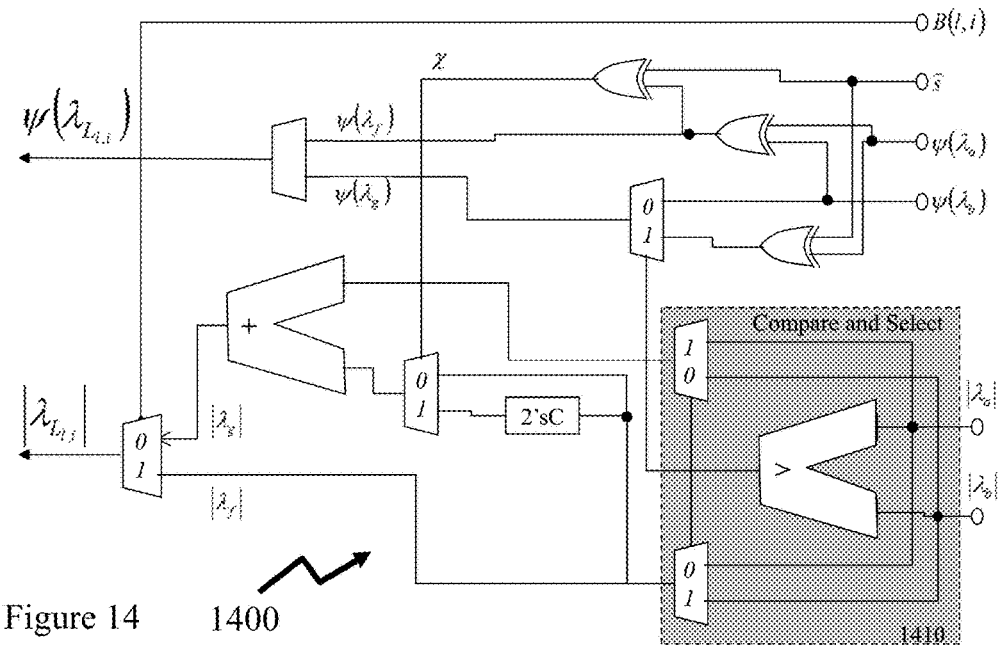
FIG. 14 depicts an exemplary architecture for generating log likelihood ratio and sign with a single processing element according to an embodiment of the invention.

These computations have been implemented by the inventors using a single XOR gate and a (Q−1)-bit compare-select (CS) operator circuit 1410, as depicted within circuit schematic 1400 in FIG. 14. The $\lambda_g$ function, on the other hand, is implemented using an SM adder/subtractor. In SM format, $\psi(\lambda_g)$ and $|\lambda_g|$ depend not only on $\hat{s}$, $\psi(\lambda_a)$, $\psi(\lambda_b)$, $|\lambda_a|$, and $|\lambda_b|$ but also on the relation between the magnitudes $|\lambda_a|$ and $|\lambda_b|$. For instance, if $\hat{s}=0$, $\psi(\lambda_a)=0$, $\psi(\lambda_b)=0$, and $|\lambda_a|>|\lambda_b|$, then $\psi(\lambda_g)=\psi(\lambda_a)$ and $|\lambda_g|=|\lambda_b|-|\lambda_a|$. This relationship between $|\lambda_a|$ and $|\lambda_b|$ is represented by bit $\gamma_{ab}$, which is generated using a magnitude comparator according to Equations (31A) and (31B).

$$\gamma_{ab}=1 \text{ if } |\lambda_a|>|\lambda_b| \qquad (31A)$$

$$\gamma_{ab}=0 \text{ otherwise} \qquad (31B)$$

The sign $\psi(\lambda_g)$ depends on four binary variables, $\psi(\lambda_a)$, $\psi(\lambda_b)$, $\hat{s}$, and $\gamma_{ab}$. By applying standard logic minimization techniques to the truth table of $\psi(\lambda_g)$ then we obtain the following simplified Boolean Equation (32).

$$\psi(\lambda_g)=\overline{\gamma_{ab}}\cdot\psi(\lambda_b)+\gamma_{ab}\cdot(\hat{s}\oplus\psi(\lambda_a)) \qquad (32)$$

where $\oplus$, $\cdot$, and + represent binary XOR, AND and OR functions, respectively.

As depicted in FIG. 14, the computation of $\psi(\lambda_g)$ only requires an XOR gate and a multiplexer, while $\gamma_{ab}$ is already available from the CS operator circuit 1410, which is shared between $\gamma_F$ and $\lambda_g$. On the other hand, the magnitude $|\lambda_g|$ is the addition or subtraction of $\max(|\lambda_a|,|\lambda_b|)$ and $\min(|\lambda_a|,|\lambda_b|)$ as defined by Equation(33):

$$|\lambda_g|=\max(|\lambda_a|,|\lambda_b|)+(-1)^\chi \min(|\lambda_a|,|\lambda_b|) \qquad (33)$$

$$\chi=\hat{s}\oplus\psi(\lambda_a)\oplus\psi(\lambda_b) \qquad (34)$$

where bit $\chi$ determines whether $\min(|\lambda_a|,|\lambda_b|)$ should be inverted or not and is defined by Equation (34). As depicted $|\lambda_g|$ is implemented using an unsigned adder, a multiplexer, and a two's complement operator, used to negate a number so that the unsigned adder can be used to perform subtraction by overflowing, in addition to the shared CS operator. Finally, the result of the processing element is determined by bit B(l,i) such that the PE outputs based upon Equations (35A/B) and (36A/B).

$$\psi(\lambda_{L_{l,i}})=\psi(\lambda_f) \text{ when } B(l,i)=0 \qquad (35A)$$

$$\psi(\lambda_{L_{l,i}})=\psi(\lambda_g) \text{ otherwise} \qquad (35B)$$

$$|\lambda_{L_{l,i}}|=|\lambda_f| \text{ when } B(l,i)=0 \qquad (36A)$$

$$|\lambda_{L_{l,i}}|=|\lambda_g| \text{ otherwise} \qquad (36B)$$

4C.2 LLR Memory—Throughout the decoding process, the PEs compute LLRs which are reused in subsequent steps of the process. To allow this reuse to take place, the SPSC decoder must store those intermediate estimates in a memory. Leroux has shown that (2N−1) Q-bit memory elements are sufficient to store the received vector and all of the intermediate Q-bit LLR estimates. This memory can be conceptually represented as a tree structure in which each level stores LLRs for a stage l of the decoding graph, with $0\leq l\leq n$. Channel LLRs are stored in the leaves of the tree whereas decoded bits are read from the root.

In order to avoid introducing additional delays in decoding, the inventors have sought to maintain a single-clock-cycle operation of the PEs 1240, which requires, therefore, that the PEs 1240 can simultaneously read their inputs and write their outputs in a single clock cycle. One low complexity solution is to implement these parallel accesses using a register-based architecture, as was proposed by Leroux in respect of the line architecture decoder. However, preliminary synthesis results showed that the routing and multiplexing requirements associated with this approach become unsuitable for the very large code length requirements set by polar codes. Accordingly, the inventors have established an alternate approach according to embodiments of the invention wherein this parallel access memory is based upon RAM 1220. Within a polar code decoder, the PEs 1240 consume twice as much information as they produce and hence an SPSC decoder according to an embodiment of the invention uses a dual-port RAM 1220 configured with a write port of width PQ and a read port of width 2PQ. Using RAM 1220 provides an additional benefit in that it also significantly reduces the area per stored bit over the register-based approach.

Figure 15:
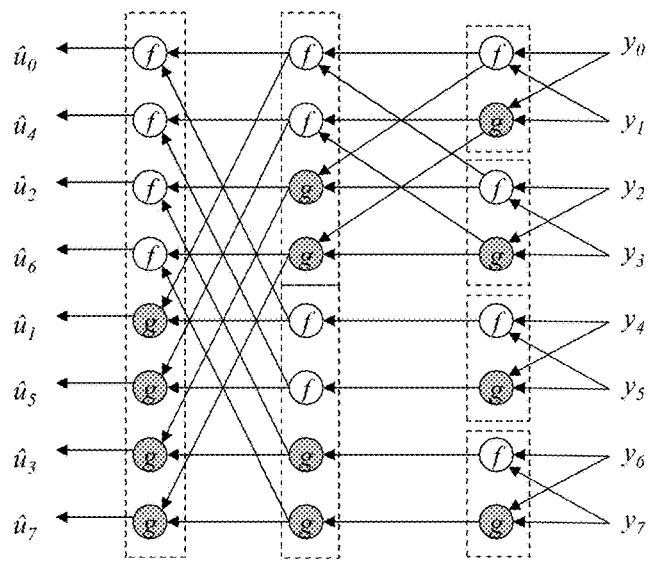
FIG. 15 depicts a mirrored decoding graph for a polar code of N=8 according to an embodiment of the invention.

To further enhance the performance of the memory elements in their cooperative operation with the PEs the inventors have further established a specific placement of data within the RAM 1220. Within each memory word, LLRs must be properly aligned such that data is presented in a coherent order to the PEs. For example, for the {N=8;P=2} SPSC decoder according to an embodiment of the invention as depicted in FIG. 1B computes $\lambda_{L_{1,0}}$ and $\lambda_{L_{1,1}}$ by accessing a memory word containing $\{\lambda_{l_{2,0}},\lambda_{l_{2,2}},\lambda_{l_{2,1}},\lambda_{l_{2,3}}\}$ in this order, which follows the bit-reversed indexing scheme of Arikan, and presenting those LLRs to the PEs. Effecting this bit-reversal throughout in this manner leads to a mirrored decoding graph, as seen in FIG. 15, with bit-reversed vectors for the channel information x and the decoded output û.

This ordering is advantageous since the processing elements only access contiguous values in memory. For example, LLRs $\{\lambda_{L_{2,0}},\lambda_{L_{2,2}},\lambda_{L_{2,1}},\lambda_{L_{2,3}}\}$, discussed earlier, are now located in LLR locations $\{8,9,10,11\}$ in memory, after the received vector x. This observation holds true for any nodes emulated by a PE in the mirrored graph. This means that the decoder can now feed a contiguous block, word 2 in FIG. 16 according to an embodiment of the invention, of memory directly to the PEs 1240. This means that the received vector y must be stored in bit-reversed order in memory, which can be easily done by modifying the order in which the encoder sends the codeword over the channel for example.

Figure 16:
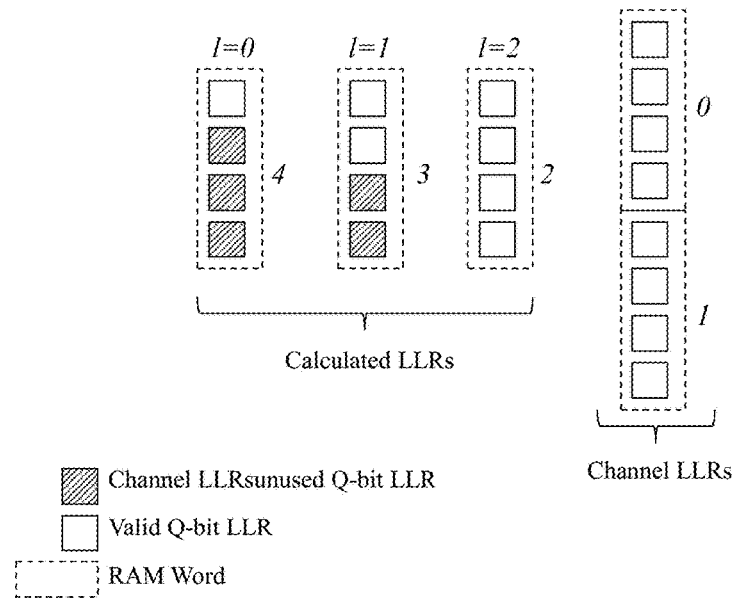
FIG. 16 depicts schematically memory organization for a semi-parallel SC decoder with N=8 and P=2 according to an embodiment of the invention.

In order to simplify the memory address generation, the inventors established the particular structure and data placement illustrated in FIG. 16, where the unused values computed by the PEs 1240 in the stages satisfying l≤p are also stored in memory, to preserve a regular structure. Beneficially this allows for a direct connection between the dual-port RAM 1220 and the PEs 1240, without using complex multiplexing logic or interconnection networks. However, this configuration according to an embodiment of the invention does have an overhead of Q(2P log$_2$ P+1) bits over the minimum required amount of memory. Beneficially, this overhead is constant with respect to code length N, which implies a reducing proportion of the overall memory requirements represents this overhead as the code length increases, for a fixed P. According to an embodiment of the invention the approach described supra requires an addition 769Q bits of RAM for P=64, regardless of code size. The overhead for a {N=1024;P=64} polar code ($2^{10}$) has been estimated at approximately 38% but this reduces rapidly to only approximately 1% for a N=32,768 decoder ($2^{15}$) with the same parameters.

4C.3: Bypass Buffer 1235—When a graph stage l, where l≤p, is processed, the data generated by the PEs 1240 needs to be reused immediately after being produced. Accordingly, if we assume that the LLR RAM 1220 does not have write-through capability, then a PQ-bit buffer register is required to loop this generated data directly back to the input of the PEs, while preventing a combinatorial loop in the circuit.

4C.4: Channel Buffer 1210—As the RAM 1220 operates on PQ-bit words natively, a buffer may be introduced at the input of the SPSC decoder to accumulate P Q-bit LLRs from the channel before writing them to RAM 1220 as a memory word. Accordingly, this buffer allows the SPSC decoder according to embodiments of the invention to receive channel LLRs serially whilst keeping the interface to the RAM 1220 uniform for both the PEs 1240 and the channel inputs respectively, depicted as Channel LLR 1200A.

4C.5: Partial Sum Registers—During the decoding process, the PEs must be provided with specific partial sums as part of $\lambda_g$. Further, whenever a bit $\hat{u}_i$ estimated, multiple partial sums may require updating. Unlike the likelihood estimates stored in the LLR memory, RAM 1220, partial sums do not have a regular structure that would allow them to be packed in memory words. Storing these within RAM would lead to scattered memory accesses requiring multiple clock cycles. Accordingly, to avoid lowering the throughput of the decoder, the inventors exploit registers to store them according to embodiments of the invention. According to an embodiment of the invention each g node of the decoding graph is mapped to a specific flip-flop in the partial sum register. The partial sum update logic module, described below in Section 4C.6 Partial Sum Update Logic, updates the values of this register each time a bit $\hat{u}_i$ estimated. Within SPSC 1200 this partial sum update logic module is depicted by ŝ Update Logic 1250 and ŝ Registers 1255.

Figure 17:
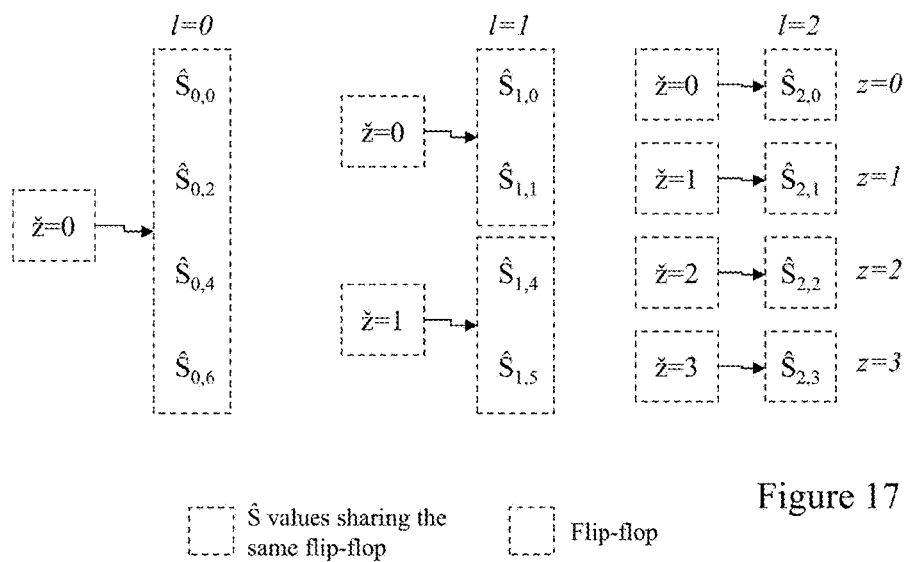
FIG. 17 depicts schematically an exemplary register architecture for a semi-parallel SC decoder according to an embodiment of the invention.

The inventors, from additional analysis, have established that N−1 bits are sufficient to store the required partial sums as the use of these memory locations may be time multiplexed between all the nodes emulated by a given processing element. Further, the inventors have established from their analysis that the g nodes can be grouped into 2l groups in each stage l, each group only requiring a single bit of memory to store their partial sums, for a total of (N−1) memory bits. For example, referring to FIG. 1B, it is evident that all partial sums in stage 0 may be stored in a single bit, provided that this bit is reset at each odd clock cycle of the decoding process. Similarly, we see that the nodes of stage 1 can be grouped into 2 partial sums, provided that the first two partial sums are stored in the same location (same for the last two), and that both locations are reset at clock cycles 3 and 7. Referring to FIG. 17 there is depicted a mapping according to an embodiment of the invention for mapping each partial sum to one of the (N−1) 1-bit flip-flops, for N=8.

4C.6: Partial Sum Update Logic—Every computation of the function $\lambda_g$ requires a specific input $\hat{s}_{l,z}$ corresponding to a sum of a subset of the previously estimated bits $\hat{u}_0^{N-1}$, see E. Sasoglu et al in "Polarization for Arbitrary Discrete Memoryless Channels" (Proc. IEEE Inf. Theory Workshop, 2009, pp. 144-148. This subset of $\hat{u}_0^{N-1}$ being required for the g node with index z when decoding bit i in stage l is determined according to the indicator function defined by Equation (37).

$$I(l, i, z) = \overline{B(l, i)} \cdot \prod_{v=l}^{n-2}(\overline{B(v, z) \oplus B(v+1, i)}) \cdot \prod_{w=0}^{l-1}(\overline{B(w, z)} + B(w, i)) \quad (37)$$

where · and Π are the binary AND operation, + the binary OR operation, and $$B(a, b) \triangleq \frac{b}{2^a} \bmod 2.$$

An estimated bit $\hat{u}_i$ is included in the partial sum if the corresponding indicator function value is 1. For example, the values of the indicator function when N=8 and l=2 are given by Equation (38) and the first four partial sums are given by Equations (39A) through (39D) respectively.

$$I(2, i, z) = \begin{bmatrix} 1 & 0 & 0 & 0 \\ 1 & 1 & 0 & 0 \\ 1 & 0 & 1 & 0 \\ 1 & 1 & 1 & 1 \\ 0 & 0 & 0 & 0 \\ 0 & 0 & 0 & 0 \\ 0 & 0 & 0 & 0 \\ 0 & 0 & 0 & 0 \end{bmatrix} \quad (38)$$

$$\hat{s}_{2,0} = \hat{u}_0 \oplus \hat{u}_1 \oplus \hat{u}_2 \oplus \hat{u}_3 \quad (39A)$$

$$\hat{s}_{2,1} = \hat{u}_1 \oplus \hat{u}_3 \quad (39B)$$

$$\hat{s}_{2,2} = \hat{u}_2 \oplus \hat{u}_3 \quad (39C)$$

$$\hat{s}_{2,3} = \hat{u}_3 \quad (39D)$$

Using the indicator function, the general form of the partial sum update equation is given by Equation (40) where ⊕ CD is the binary XOR operation. In terms of hardware implementation, since each evaluation of function g requires a different partial sum $\hat{s}_{l,z}$, flip-flops are used within embodiments of the invention to store all required combinations. As the hard decisions $\hat{u}_i$ are obtained sequentially as decoding progresses, the contents of flip-flop (l,z) are produced by adding $\hat{u}_i$ to the current flip-flop value if I(l,i,z)=1. Otherwise, the flip-flop value remains unchanged. Using the time multiplexing described in the previous section, the indicator function can be further simplified to that defined in Equation (41) below.

$$\tilde{s}_{l,z} = \bigoplus_{i=0}^{N-1} u_i \cdot I(l, i, z) \quad (40)$$

$$I'(l, i, z) = \overline{B(l, i)} \cdot \prod \left( \overline{B(l-v-1, \tilde{z})} + B(v, i) \right) + B(v, i) \quad (41)$$

where $\hat{z}$ corresponds to the index of the flip-flops within a stage. Since time multiplexing is used in the partial sum registers, a flip-flop in stage l effectively holds $2^{n-l-1}$ partial sums, at different points in the decoding process. Both indexing methods are illustrated in FIG. 17.

4C.7: Frozen Channel ROM 1245—A polar code is completely defined by its code length N and the indices of the frozen bits in the vector u. The SPSC architecture according to embodiments of the invention stores the indices of those frozen bits in a 1-bit ROM of size N. Every generated soft output $\lambda_{L_0,i}$ passes through the $u_i$ Computation Block 1270, which sets the output to the frozen bit value if indicated by the contents of ROM 1245, or performs a threshold-detection-based hard decision otherwise, wherein the output of $u_i$ Computation Block 1270 is coupled to the output Decoded Bit 1200B. This ROM 1245 is addressed directly using the current decoded bit i. It would be evident that this implementation according to embodiments of the invention provides the potential for easily reprogramming the SPSC decoder for different operational configurations by replacing the contents of this ROM 1200 with a different set of frozen bits; as for embodiments of the invention the architecture of the decoder is decoupled from its operational parameters. Additionally as a polar code may be created for given channel conditions, e.g. the noise variance for the AWGN channel, then replacing the ROM by a RAM would allow the indices of the frozen bits to be changed dynamically allowing for the decoder to adapt to the current channel conditions and changes in polar code employed to encode the data being transmitted.

4C.8: Controller—The controller module, depicted by Control Logic 1260, coordinates the various phases and components of the decoding process. To support those tasks, it must compute different control signals, such as the current decoded bit i, the current stage l, and the portion ε of a stage being processed, where $0 \leq \varepsilon \leq (2^l/P)$. As it is sequential, the calculation of i is straightforward, using a simple n-bit counter enabled each time the decoder reaches l=0. The stage number l in comparison involves a slightly more complex computation as illustrated in FIG. 10 as it relies upon both i and ε. Whenever $\varepsilon \geq (2^l/P)$, i is updated and l is modified such that it is set to the index of the first bit set in the binary representation of the updated value of i, or to n−1 when i wraps around N−1.

As a stage l needs $2^l$ calculations, it requires $(2^l/P)$ uses of the PEs and thus the same number of clock cycles to perform all computations associated with this stage. Therefore, a simple counter is used to keep track of ε, with a reset conditioned on the above condition. The controller also controls a multiplexer located at the input of the RAM as during the input phase, this multiplexer selects the channel buffer as the input to the RAM and during the decoding it selects the outputs of the PEs instead. Additionally, the controller selects the input of the PEs using a set of multiplexers located at the output of the RAM, depending on the value of the read and write addresses provided to the RAM. If those addresses point to overlapping locations in memory, it selects the bypass buffer as part of the inputs to the PEs: it bypasses the low part of the memory output if the least significant bit (LSB) of the write address is 0 and the high part of the memory output if the write address LSB is 1. Finally, the controller selects the function (f or g) to be performed by the PEs based upon B(l,i) as described B(l,i), as described in Section 4A Scheduling Principles.

4D: Hardware Implementation—Within this section the effects of implementation parameters on error-correction performance of SPSC decoders according to embodiments of the invention are presented together with implementation results for FPGA and ASIC designs.

Figure 18:
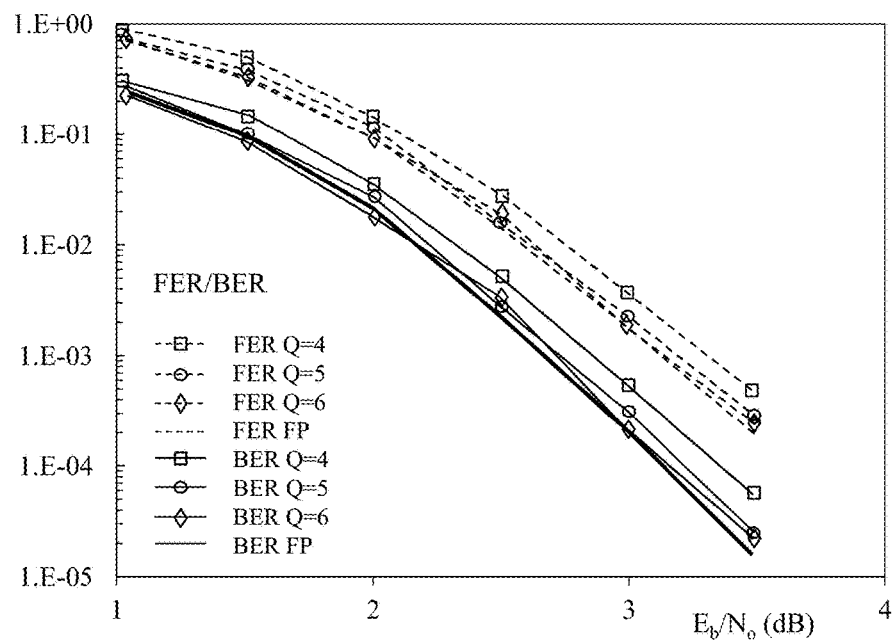
FIG. 18 depicts the effect of quantization on the error-correction performance of a semi-parallel SC decoder according to an embodiment of the invention.

4D.1: Decoding Performance—Amongst the factors impact the error-correction performance of the hardware SPSC decoder the number of quantization bits Q used to represent LLRs and the maximum channel symbol magnitude allowed before saturation occurs are two important ones. Referring to FIG. 18 there are shown BER results for the (1024, 512) code using Q={4,5,6} quantization bits, in addition to the BER of the non-quantized decoder. The quantized decoder inputs were limited to the range [−2,2] and values outside this range were clipped. From FIG. 14 it is evident that when using 4 quantization bits, the BER is degraded by less than 0.25 dB against the non-quantized decoder. However, increasing Q to 5 results in performance almost matching that of the non-quantized decoder and further increasing Q offers little performance benefit for this SPSC decoder according to embodiments of the invention. Accordingly, within the FPGA and ASIC implementation analysis the inventors have utilized Q=5 and saturated the decoder input for [−2,2].

4D.2:—FPGA Implementation—To the knowledge of the inventors there has been only one other hardware implementation of a polar code decoder within the prior art, see A. Pamuk, "An FPGA Implementation Architecture for Decoding of Polar Codes" (8th Int. Symp. Wireless Comm Sys., 2011, pp. 437-441). Pamuk implemented a belief propagation (BP) decoder on a Xilinx™ FPGA and presented throughput and error-correction performance results. The error-correction performance of this BP decoder was provided for 50 decoding iterations without early termination and essentially matches that of an SC decoder according to an embodiment of the invention for Q=4. However, the throughput results presented by Pamuk were provided for 5 iterations of the decoder, rather than the 50 for error-performance, and accordingly we have scaled these throughputs down by a factor of 10 to allow a comparison of the Pamuk BP decoder and SC decoder according to an embodiment of the invention at the same error-correction performance. The results of this comparison are presented in Table 3, which summarizes the resources used by a Pamuk BP decoder and SC decoder according to an embodiment of the invention having the same error-correction performance. From this we can see that the proposed SC decoder according to an embodiment of the invention utilizes fewer resources, especially memory resources, while providing an information throughput an order of magnitude greater than that of the Pamuk BP decoder.

TABLE 3

Resource Utilization of the BP and SPSC Decoders on the Xilinx Virtex IV XC4VSX25-12 FPGA for (1024, 512) polar code

| Algorithm | Look-Up Tables | Flip-Flops | Bits RAM | T/P (Mbps) |
|---|---|---|---|---|
| Pamuk BP | 2,794 | 1,600 | 12 | 2.78 |
| SPSC | 2,600 | 1,181 | 5 | 22.22 |

The BP decoder may reduce the number of iterations at high SNR to increase its throughput. However, such a strategy would increase the implementation complexity and was not reported by Pamuk. In addition to the N=1024 code, the inventors also implemented codes up to $N=2^{17}=131,072$ in length. Table 4 presents the synthesis results for these codes on an Altera Stratix IV FPGA wherein Q=5 and the number of PEs implemented was fixed at 64 as it was able to achieve over 90% of the throughput of a line architecture decoder according to an embodiment of the invention running at the same frequency. The results for P=16 are also included for the N=1024 code because the throughput loss due to the semi-parallel nature of the SPSC decoder is offset by a higher clock frequency. From Table 4, we note that the number of look-up tables (LUTs), flip-flops (FFs), and RAM bits grows linearly in code length N.

TABLE 4

FPGA Synthesis Results for SPSC Decoders on the Altera Stratix IV EP4SGX530KH40C2 with Varying Polar Code Length

| N | P | LUT | FF | RAM (bits) | f (MHz) | T/P (Mbps) |
|---|---|---|---|---|---|---|
| $2^{10}$ | 16 | 2,888 | 1,388 | 11,904 | 196 | 87R |
| $2^{10}$ | 64 | 4,130 | 1,691 | 15,104 | 173 | 85R |
| $2^{11}$ | 64 | 5,751 | 2,718 | 26,368 | 171 | 83R |
| $2^{12}$ | 64 | 8,635 | 4,769 | 48,896 | 152 | 73R |
| $2^{13}$ | 64 | 16,367 | 8,868 | 93,952 | 134 | 64R |
| $2^{14}$ | 64 | 29,897 | 17,063 | 184,064 | 113 | 53R |
| $2^{15}$ | 64 | 58,480 | 33,451 | 364,288 | 66 | 31R |
| $2^{16}$ | 64 | 114,279 | 66,223 | 724,736 | 56 | 26R |
| $2^{17}$ | 64 | 221,471 | 131,764 | 1,445,632 | 10 | 4.6R |

The frequency decreases almost linearly in the logarithm of the code length n. Analysis by the inventors revealed that the reduction in operating frequency is largely due to the partial-sum update logic. Since the implementation of the SPSC decoder according to an embodiment of the invention, except the contents of the frozen-bit ROM, remains the same regardless of the code rate R used, the operating clock frequency is independent of R. For example, the $N=2^{16}$ code has an information-bit throughput equal to 26.35R Mbps and so high values of R can be used to reach a throughput close to 26.35 Mbps. The information throughput values as a function of the code rate R for the other code lengths are also provided in Table 4. The throughput of the line architecture decoder according to an embodiment of the inventions is given by 0.5*f*R. As such, it will be faster than a SPSC decoder according to an embodiment of the invention operating at the same frequency but with increased complexity. However, as indicated by the results for the N=1024 code, increasing P reduces the operating frequency. As a result, a line architecture decoder according to an embodiment of the invention if it is implementable given the available hardware resources will have a lower operating frequency and a higher complexity than a semi-parallel decoder according to an embodiment of the invention. The largest line decoder that was successfully synthesized for this FPGA was of length $N=2^{12}$.

In order to compare the resource utilization and speed of the semi-parallel architecture polar decoder according to an embodiment of the invention to those of other codes, we have elected to use the convolutional turbo code (CTC) decoder for the 802.11e (WiMAX) standard presented in Pamuk as the comparison. Accordingly, we found that a (4096,2048) polar code yielded a FER within 0.2 dB of the (960,480) CTC WiMAX code and a (8192,4096) polar code was within 0.1 dB. Accordingly, in Table 5 the throughput and synthesis results of decoders for these three codes are presented. For the (4096, 2048) code, the implementation complexity is comparable to the CTC Decoder as the SPSC requires more LUTs, but fewer flip-flops and block-RAM banks Further, the throughput of SPSC decoder according to an embodiment of the invention is 30% higher than that of the CTC decoder, even though it has a lower clock frequency. In comparison the SPSC decoder had higher complexity than the CTC decoder and its throughput was 7% lower.

TABLE 5

Comparison of SPSC Decoders with an 802.16e (WiMAX) CTC Decoder on a Xilinx XC5VLX85 FPGA

| Decoder | LUT | FF | BRAM | DSP | f (MHz) | T/P (Mbps) |
|---|---|---|---|---|---|---|
| CTC | 6,611 | 6,767 | 9 | 4 | 160 | 30 |
| SPSC (4096) | 7,356 | 4,293 | 6 | 0 | 94 | 39 |
| SPSC (8192) | 12,154 | 8,386 | 10 | 0 | 68 | 28 |

4D.3: ASIC—Implementation In addition to the FPGA implementations the inventors has also synthesized the semi-parallel SC decoder according to embodiments of the invention as an ASIC using Cadence RTL Compiler with a 65 nm TSMC standard-cell library. The results of these synthesis results for different code lengths with a target clock frequency set to 500 MHz are presented in Table 6. It can be seen from this analysis that the majority of the die area is occupied by the circuitry required to store the LLR results of the calculations. This is in large part due to the use of registers instead of RAM which arose as the inventors did not have access to a RAM compiler for the 65 nm technology employed. The partial-sum update circuitry also occupied a sizable portion of the design as a result of the large amount of multiplexing and logic required by these operations. Also presented in Table 6 are the throughput values for these designs which are all greater than 240R Mbps for SPSC decoders according to embodiments of the invention.

TABLE 6

ASIC Synthesis Results Targeting the TSMC 65 nm Process at 500 MHz

| N | P | Q | Area ($\mu m^2$) | LLR Mem. (%) | Part. Sums (%) | PEs (%) | Control (%) | T/P (Mbps) |
|---|---|---|---|---|---|---|---|---|
| $2^{10}$ | 64 | 5 | 308,693 | 76.10 | 17.52 | 4.77 | 0.48 | 246.1R |
| $2^{11}$ | 64 | 5 | 527,103 | 77.15 | 18.85 | 2.99 | 0.33 | 244.2R |
| $2^{12}$ | 64 | 5 | 940,420 | 76.60 | 20.91 | 2.00 | 0.23 | 242.4R |
| $2^{13}$ | 64 | 5 | 1,893,835 | 79.92 | 18.78 | 0.97 | 0.15 | 240.6R |

5. Enhanced Throughput Simplified Successive Cancellation Decoder

As noted supra the inventors, see Leroux, showed that prior art approaches to addressing the low decoding throughput of successive-cancellation (SC) polar code decoders, approximately 0.5*ClockFreq*CodeRate=0.5*f*R, with fully parallel belief propagation (BP) decoders results in decoders that are increasing impractical to implement with increasing code length which is an important limitation as polar codes approach capacity slowly with code length and require long codes for good error-correction. Further, the inventors, see Leroux, also showed that practical BP decoders have higher complexity and lower throughput than resource constrained semi-parallel successive cancellation decoders (SPSC) according to embodiments of their invention.

Accordingly, within Section 4 SPSC decoder architecture according to embodiments of the invention was presented wherein the number of PEs implemented was reduced from those presented in Section 3 with line architecture decoders according to other embodiments of the invention. These SPSC encoder designs allowed for significant reductions in hardware design complexity and die footprint for long polar codes wherein the reduced PEs and memory providing the constrained resources for decoding were offset by each codeword requiring a small increase in the number of clock cycles required to decoding, thereby reducing throughput of SPSC decoders relative to line architecture decoders. Accordingly, in this section the inventors have applied their inventive design methodologies of constrained resources in conjunction with inventive maximum likelihood nodes to simplified successive cancellation decoders to increase throughput.

Simplified successive-cancellation (SSC) decoding was proposed as a method to improve the latency, and in turn throughput, of SC decoding while reducing decoding complexity without affecting the error-correction performance, see for example Alamdar-Yazdi. Alamdar-Yazdi teaches to increase the parallelism of SC decoding by operating at the constituent-code, instead of bit, level wherein for constituent codes with a rate zero, i.e. containing only frozen bits, no operations are performed whilst the output of the constituent codes with rate one, i.e. containing only non-frozen bits, is calculated in one time step using threshold detection. The throughput achieved by SSC decoding according to Alamdar-Yazdi varied between two and twenty times that of SC decoding depending on code length.

An alternate method of improving SC decoders using look-ahead techniques was proposed to increase throughput by pre-computing future bit likelihoods and choosing the appropriate value once the current bit value is estimated was presented by C. Zhang et al in "Reduced-Latency SC Polar Decoder Architectures" (Proc. IEEE Int. Conf. Comms., ICC'12, pp 1-5). The throughput of this method was twice that of SC decoding but applying this method to SSC decoding would not increase the latter's speed significantly.

As the gains obtained by using SSC decoding are at minimum comparable to the look-ahead technique and typically significantly greater, the inventors have focused on improving the SSC concept. It should be noted that while the analysis employs systematic polar codes, see E. Arikan in "Systematic Polar Coding" (IEEE Comm Lett., Vol. 15, pp. 860-862) that comparable throughput results can be obtained using non-systematic codes as well.

Figure 19A:
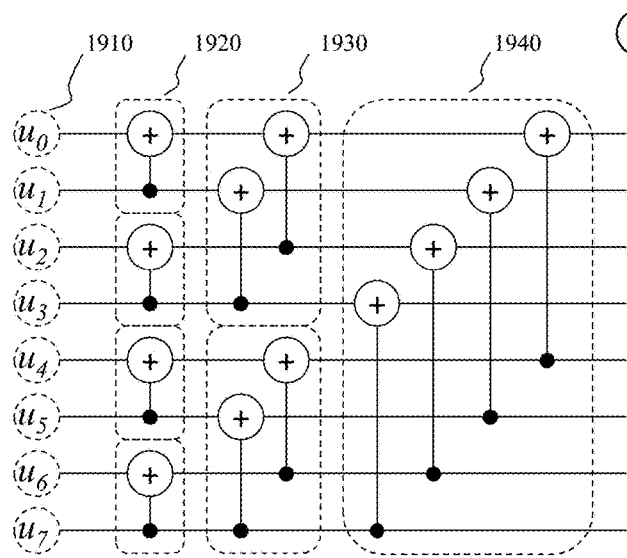
FIGS. 19A and 19B depict standard and tree representations for an SC decoder for an (8,3) code.
Figure 19B:
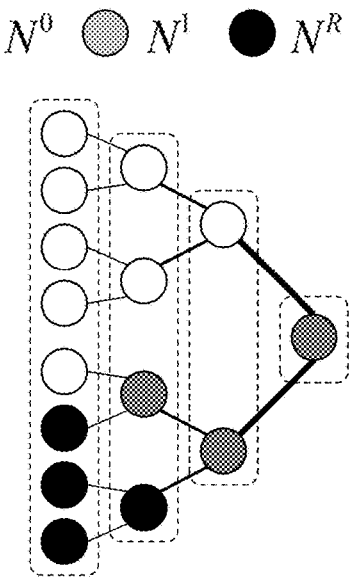

5A. Simplified Successive-Cancellation—Decoding An SSC decoder graph is constructed by converting a non-bit reversed polar code graph, such as depicted in FIG. 1B, into a binary tree of three node types: rate-zero nodes, rate-one nodes, and rate-R nodes, denoted $N^O$, $N^1$, and $N^R$, respectively. Frozen bits in the polar code are $N^O$ nodes, and non-frozen bits are $N^1$ nodes. A variant representation of the standard SC decoder graph for a (8,3) polar code is shown in FIG. 19A with the frozen bits in gray. The $u_i$ bit nodes from FIG. 19A become the leaf nodes in the SC decoder tree shown in FIG. 19B where the type of a node in the SC tree is determined according to the leaf-nodes descending from it. For a node where all its descendant leaf nodes are $N^O$ nodes, the node is also an $N^O$ node; if the descendant leaf nodes are $N^1$ nodes, it is also an $N^1$ node; finally, a node whose descendants contain both $N^O$ and $N^1$ nodes is an $N^R$ node. Groups of nodes in the standard SC graph that form one node each in the SC tree, are indicated by a bounding box in FIG. 19A.

Figure 20:
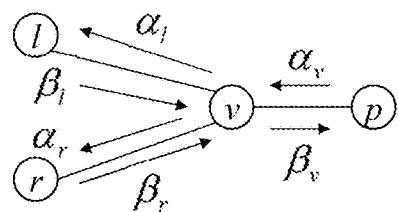
FIG. 20 depicts node message flows within an SSC decoder according to the prior art.

A node v in the SC tree has a parent p and two children l and r with which it exchanges real-valued message vectors $\alpha_i$ and binary-valued message vectors $\beta_i$ as indicated in FIG. 20. The size of the message vectors depends on the tree level in which the node is located. Assuming that leaf nodes are located in level zero and that v is located in level d(v), then $\alpha_l$, $\beta_l$, $\alpha_r$, and $\beta_r$ contain $2^{d(v)-1}$ elements, and $\alpha_v$ and $\beta_v$ contain $2^{d(v)}$ elements. Once $\alpha_v$ is available from the parent, $\alpha_l$ is calculated according to Equation (42).

$$\alpha_l[i] = \alpha_v(i) \boxplus \alpha_v[2^{d(v)-1}+i] \text{ for } 0 \leq i \leq 2^{d(v)-1} \quad (42)$$

where $\boxplus$ is defined by Alamdar-Yazdi using sum-product update rules and LLRs, where the LLR of a bit x is ln $$\frac{Pr(x=0)}{Pr(x=1)},$$

as defined by Equation (43), $$a \boxplus b = 2\tanh^{-1}(\tanh(a/2))\tanh(b/2) \quad (43)$$

The child l then calculates $\beta_l$, which is used to compute the value of $\alpha_r$ so that in the LLR domain it is defined by Equation (44). After $\beta_r$ has been calculated, it is combined with $\beta_l$ to obtain $\beta_v$ according to Equations (45A) and (45B) where $\oplus$ is modulo-2 addition (binary XOR).

$$\alpha_r[i] = (1-2\beta_l[i])\alpha_v[i] + \alpha_v[2^{d(v)-1}+i] \text{ for } 0 \leq i \leq 2^{d(v)-1} \quad (44)$$

$$\beta_v[i] = \beta_l[i] \oplus \beta_r[i] \text{ for } 0 \leq i \leq 2^{d(v)-1} \quad (45A)$$

$$\beta_v[i]\beta_r[i] \text{ for } 2^{d(v)-1} \leq i \leq 2^{d(v)} \quad (45B)$$

Since leaf nodes do not have children, they calculate $\beta_v$ directly from $\alpha_v$ using one-bit quantization according to Equations (46A) and (46B) respectively. In this case, $\alpha_v$ and $\beta_v$ are one-element vectors.

The root node's $\alpha_v$ input is calculated directly from the received channel information and its $\beta_v$ output is the systematic codeword from which the information bits can be extracted. Alamdar-Yazdi noted that the $\beta_v$ output of $N^O$ nodes is always a zero vector if the frozen-bit values are chosen to be zero; therefore, the decoder need not calculate $\alpha_v$ values for $N^O$ nodes and wait for the resulting $\beta_v$, instead it can proceed knowing that $\beta_v$ will be the zero vector. Another simplification introduced by Alamdar-Yazdi is that since $N^1$ nodes correspond to constituent codes of rate one, calculating $\beta_v$ directly from $\alpha_v$ using one-bit quantization yields results identical to those obtained if $\alpha_v$ were to be actually decoded recursively. These two simplifications allow the decoder to stop traversing a path in the tree once a $N^O$ or a $N^1$ node is encountered, resulting in a significant reduction in the number of graph nodes. Such a decoder is called a Simplified Successive Cancellation (SSC) decoder and its tree is shown in FIG. 21B together with the original tree for an SC decoder in FIG. 21A. Accordingly, an SSC decoder has only seven nodes to traverse instead of fifteen nodes to traverse for an (8, 3) polar code.

5B: Latency of Node Updates under Resource Constraints—In Section 4 the inventors presented a resource constrained decoder approach to semi-parallel SC (SPSC) decoders to provide design methodologies with respect to constraining PEs and mapping memory in order to allow significant reductions in hardware complexity to be obtained for the SPSC encoders without significant performance degradation and/or increase in latency. Accordingly, the inventors have applied the same methodologies to SSC decoders and in contrast to Alamdar-Yazdi, the inventors seek to match each decoder time step with a clock cycle in a hardware implementation of the decoder. Accordingly, latency is presented under the constraint that only P PEs are available, i.e. only P elements of a message vector can be calculated simultaneously when evaluating Equations (42) and (44). Throughout this work, as previously in Section 4, the analysis assumes that P is a power of 2.

The number of time steps, referred to as latency, required by a $N^R$ node v varies based on the value of d(v). If $2^{d(v)-1} \leq P$, v can calculate each of its messages in one time step; therefore, the latency of this node will be three time steps. On the other hand, if $2^{d(v)-1} > P$, each of $\alpha_l$ and $\alpha_r$ requires $2^{d(v)-1}/P$ time steps to be computed for a total of $2^{d(v)-1}/P+1$ time steps of latency; we assume that calculating $b_v$ will only incur one step of latency due to the simplicity of implementing Equations (45A) and (45B). The one-bit quantizer used to calculate the $b_v$ outputs of $N^1$ nodes is a sign detector that outputs a "0" when the number is positive and "1" otherwise. As the sign information of $\alpha_v$ elements is readily available regardless of the number representation used. Equations (46A) and (46B) can be trivially performed for all $\alpha_v$ elements simultaneously. Therefore, $N^1$ nodes have a latency of one time step.

In contrast, $N^0$ nodes do not incur any latency as their $\beta_v$ outputs are already known, their parent nodes can proceed to the next message calculation immediately. Moreover, since they do not require any input, their parent nodes need not calculate $\alpha_v$. In effect, not only do $N^0$ nodes not increase the latency, they actually decrease it. Combining the latencies of all the nodes of the (8,3) SSC decoder in FIG. 21B indicates that nine time steps are required until the output of the decoder is available if P≥4. Whereas a standard SC decoder would require fourteen steps, see Leroux. If we reduce P to two, the SSC decoder will require eleven time steps to finish.

5C: Maximum-Likelihood Nodes—According to the analysis above $N^R$ nodes add the most latency to the decoding process for two reasons, first their intrinsic latency as described in Section 4B Latency of Node Updates under Resource Constraints, and secondly due to the latency of all nodes in the sub-trees rooted in them. Accordingly, it would be beneficial to replace these $N^R$ nodes with other nodes that have lower intrinsic latency, are able to decode the constituent code, and calculate the output $\beta_v$ directly from the input $\alpha_v$ without the need to traverse a sub-tree. Accordingly the inventors have established an approach based upon resource constrained exhaustive-search maximum-likelihood (ML) decoding of the constituent code corresponding to an $N^R$ node as an alternative that decodes a sub-tree in a single clock cycle. Accordingly, this processing element is equivalent to the low complexity processing element presented by the inventors for SPSC decoders, see Leroux et al in "A Semi-Parallel Successive-Cancellation Decoder for Polar Codes" (IEEE Trans. Signal Process., Vol. PP, Iss. 99, pp. 1-).

An ML decoder for a binary block code C estimates the transmitted codeword $\hat{x}$ according to Equation (46) where y is the decoder's soft-valued input. Specifically, in the case of a constituent polar code of length $n_v = 2^{d(v)}$ where the input to the decoder $\alpha_v$ is composed of LLR values, then Equation (46) becomes Equation (47). The complexity of Equation (47) grows exponentially in the code dimension $k_v$ and linearly in the code length $n_v$.

$$\hat{x} = \underset{x \in C}{\mathrm{argmax}}\, Pr(y \mid x) \qquad (46)$$

$$\beta_v = \underset{x \in C}{\mathrm{argmax}} \sum_{i=0}^{n_v} (1 - 2x[i])\alpha_v[i] \qquad (47)$$

Accordingly, ML nodes $N^{ML}$ can only be used to replace $N^R$ nodes when computational resource constraints are met: calculating the sum $\Sigma(1-2x[i])\alpha_v[i]$ for each of the $2^{k_v}$ candidate codewords requires (n−1) additions, where the signs of the operands are determined by the value of x[i], and finding the codeword with the maximum likelihood requires $(2^{k_v}-1)$ comparisons. To formalize, a $N^{ML}$ node can replace a $N^R$ node v when Equation (48) is satisfied and therein performing Equation (47) requires one time step.

$$(2^{k_v}+1)(n_v-1) \leq P \qquad (48)$$

Accordingly, a (8,3) polar code can be decoded in seven time steps when using an ML-SSC decoder according to an embodiment of the invention with $n_v=2$ and $k_v=1$ therefore, P=4 which is the minimum value required for SC and SSC to achieve the aforementioned latencies, resulting in the decoder graph presented in FIG. 21C where it is shown that one $N^{ML}$ node, indicated by the striped pattern, has replaced a sub-tree of three nodes. The operations required to perform Equation (47) are already provided by the processing elements of Leroux. In addition, $N^{ML}$ nodes can use the same processing elements already required by the $N^R$ nodes. Accordingly, an ML-SSC decoder according to an embodiment of the invention does not require any additional processing elements beyond those already present in an SSC decoder. The ML decoding methodology described by Equation (47) represents one ML decoding methodology of several that can be employed. As the aim specified was to decrease decoding latency, but not to improve error-correction performance, the inventors selected this methodology over others that have lower computational complexity but lower parallelism.

5D: Update Rules and Error-Correction Performance—The ⊞ operator definition in Alamdar-Yazdi uses the sum-product algorithm (SPA) check-node update rule. However, this requires hyperbolic functions be implemented within the hardware circuit and accordingly the inventors within the hardware design have exploited the same approximations as discussed supra in respect of other hardware circuit implementations and rules for hyperbolic functions resulting in Equation (43) being replaced by Equation (49).

$$a \boxplus b = \mathrm{sign}(a)\mathrm{sign}(b)\min(|a|,|b|) \qquad (49)$$

Simulations were performed for (2048,1024) and (32768, 29491) polar codes when transmitting random codewords over the AWGN channel using binary phase shift keying (BPSK) and are depicted in FIG. 22. It is evident from these that the modified update rule, indicated by curves SSC (MS) and ML-SSC (MS) in FIG. 22, in conjunction with SSC and ML-SSC decoding has a negligible effect on error-correction performance, wherein the curves within FIG. 22 indicated simply as SSC and ML-SSC. This situation does not arise with SC decoding, see Leroux. The ML-SSC decoders within FIG. 22 were analysed under the constraints that $k_v=4$ and $n_v=16$.

Figure 23:
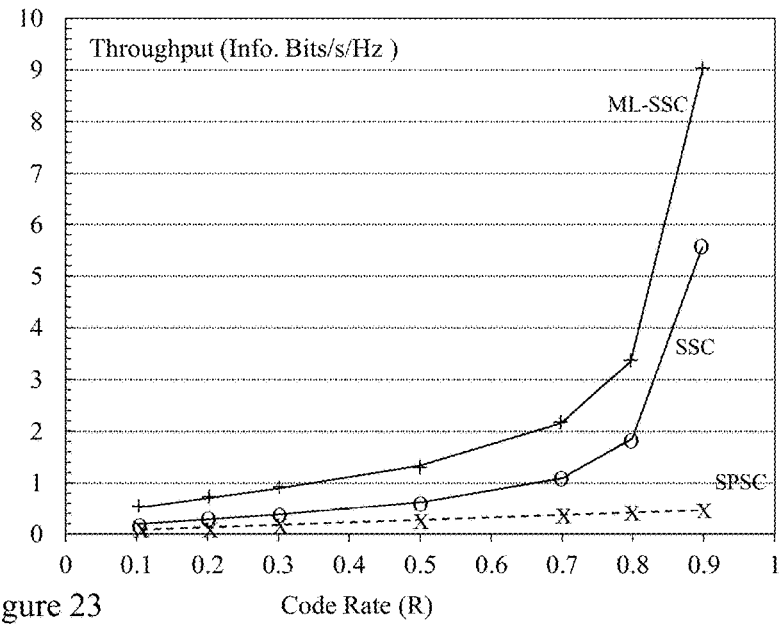
FIG. 23 depicts throughput performance of semi-parallel SC and ML-SSC decoders according to embodiments of the invention against a prior art SSC decoder for a code of length $N=2^{15}$ at different rates.

5D: Throughput—The inventors in their analysis identified two factors that significantly impact the decoding speed of SSC and ML-SSC decoders, the code rate R and code length N. To quantify this effect we use the information throughput per clock cycle, i.e. the number of information bits decoded divided by the number of clock cycles required to complete the decoding operation. The change in information throughput of SSC and ML-SSC decoding with respect to code rate shows a clear trend where the throughput is proportional to R as is evident from FIG. 23 wherein results are plotted for a polar code of length $N=2^{15}=32,768$. From these results it can be see than an SSC encoder is between 2.5 to 12.6 times faster than an SPSC decoder according to an embodiment of the invention and that an ML-SSC decoder according to an embodiment of the invention is 5.3 to 20.5 times faster than an SPSC decoder according to an embodiment of the invention. That is, an ML-SSC according to an embodiment of the invention 1.6 to 3.4 times faster than an SSC.

Figure 24:
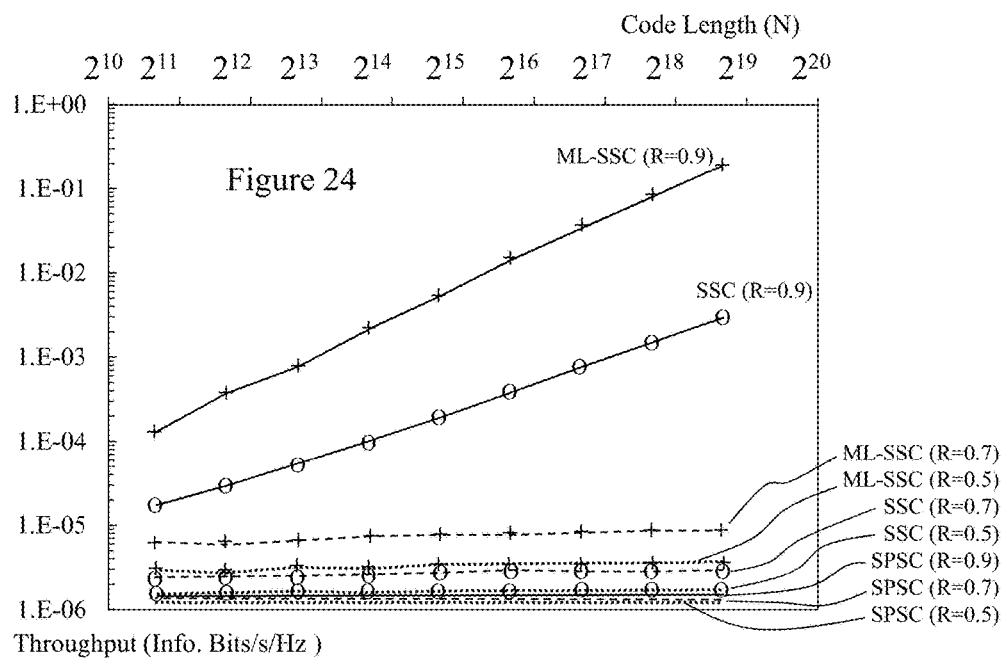
FIG. 24 depicts throughput performance of semi-parallel SC and ML-SSC decoders according to embodiments of the invention against a prior art SSC decoder for different codes at different rates.

To investigate the relation between code length and throughput, the information throughput of nine polar codes of lengths varying from $2^{11}$ to $2^{19}$, created for an AWGN channel with a noise variance $\sigma^2=0.25$, is shown in FIG. 24 for code rates of 0.5, 0.7, and 0.9. The information throughput of both the SSC and ML-SSC decoders increases in a logarithmic manner in code length and the rate of this increase is proportional to code rate. An ML-SSC decoder according to an embodiment of the invention was 4.9 to 29.3 times faster than an SPSC decoder according to an embodiment of the invention and 1.5 to 2.3 times faster than an SSC decoder. The throughput improvement resulting from using $N^{ML}$ nodes for these codes is significant enough that the ML-SSC decoder according to an embodiment of the invention with codes of rate 0.5 has higher throughput than the SSC decoder with codes of rate 0.7, enabling the use of the lower rate codes, which provide a system benefit from their better error-correction capabilities, without lowering the system's throughput.

Figure 25:
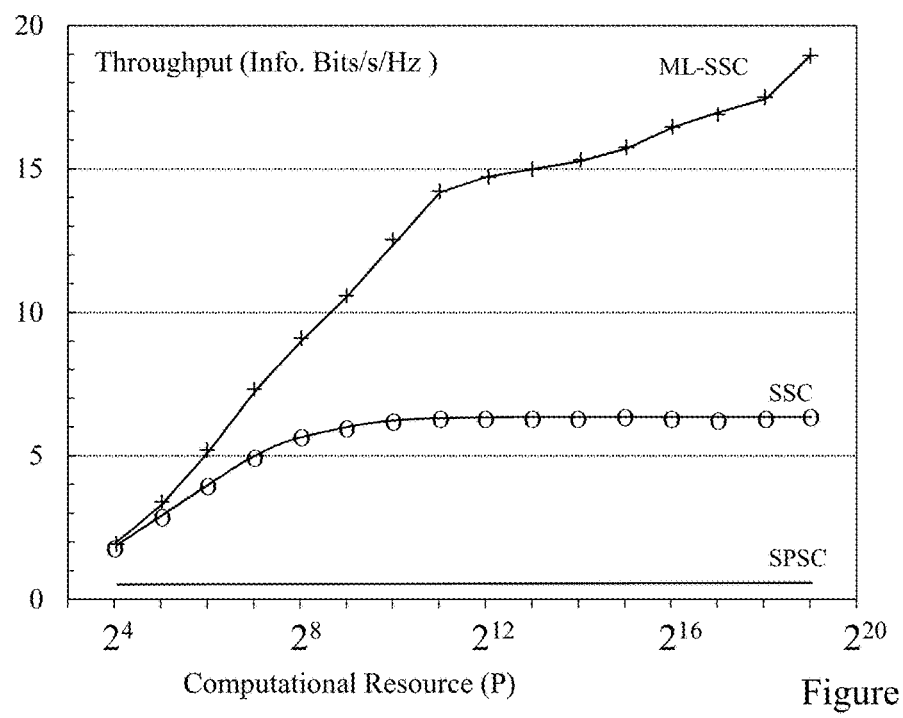
FIG. 25 depicts throughput performance of a ML-SSC decoder according to embodiments of the invention against a prior art SSC decoder as a function of available resources.

The effect of P on information throughput is depicted in FIG. 25. When P is increased for the (32768, 29491) code, the throughput of an SSC decoder increases noticeably until P=256. Subsequently, increasing P further results in small improvements and is barely present when increasing P from 512 to 1024. In contrast an ML-SSC according to an embodiment of the invention shows continued improvement as P increases. This is expected, as in the extreme, and impractical, case where $P=(2^k+1)(n-1)$, the decoder will have sufficient resources to decode a received vector in one time step.

It was noted by the inventors that the structure of the polar code, which is affected by the target channel quality, has a significant impact on the speed of both the SSC and ML-SSC decoders. This is due to the distribution of frozen bits, which affects the number of the $N^0$, $N^1$, and $N^R$ nodes within the decoder-tree as well as the resulting decoder-tree size. An ML-SSC decoder according to an embodiment of the invention, with P=256, for the (32768, 29491) polar code has an information throughput of 9.1bit/s/Hz and running at a conservative 200 MHz will achieve an information throughput of 9.1*200 Mb./S=1.82 Gb/S.

Within the descriptions supra in respect of embodiments of the invention the inventors have established polar code decoder architectural innovations that address increasing the throughput of such decoders thereby allowing increased code lengths to be employed and hence increasing a polar code encoded link's throughput closer to the theoretical channel capacity as well as reducing hardware circuit requirements to reduce die footprint and improve manufacturability. Accordingly the inventors have extended in one thread of the invention the concepts disclosed by Arikan with respect to successive cancellation decoding polar codes by adapting the architecture employed for generating the bits from the received codewords. These adaptations include, in one thread directed to increasing resultant throughput and hardware reductions, a pipelined encoder architecture, a line encoder architecture, and a semi-parallel encoder architecture. In a second thread a maximum likelihood (ML) adaptation to network nodes within simplified successive cancellation decoders allows multiple nodes to be reduced to a single node thereby reducing the number of nodes that must be traversed thereby increasing throughput. However, these threads may also be combined and the ML-SSC approach may also be combined with the semi-parallel successive cancellation decoder methodology. It would also be evident to one skilled in the art that the approaches described within this specification according to embodiments of the invention may also be applied to other decoder architectures.

Specific details are given in the above description to provide a thorough understanding of the embodiments. However, it is understood that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

Implementation of the techniques, blocks, steps and means described above may be done in various ways. For example, these techniques, blocks, steps and means may be implemented in hardware, software, or a combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described above and/or a combination thereof.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be rearranged. A process is terminated when its operations are completed, but could have additional steps not included in the figure. A process may correspond to a method, a function, a procedure, a subroutine, a subprogram, etc. When a process corresponds to a function, its termination corresponds to a return of the function to the calling function or the main function.

Furthermore, embodiments may be implemented by hardware, software, scripting languages, firmware, middleware, microcode, hardware description languages and/or any combination thereof. When implemented in software, firmware, middleware, scripting language and/or microcode, the program code or code segments to perform the necessary tasks may be stored in a machine readable medium, such as a storage medium. A code segment or machine-executable instruction may represent a procedure, a function, a subprogram, a program, a routine, a subroutine, a module, a software package, a script, a class, or any combination of instructions, data structures and/or program statements. A code segment may be coupled to another code segment or a hardware circuit by passing and/or receiving information, data, arguments, parameters and/or memory contents. Information, arguments, parameters, data, etc. may be passed, forwarded, or transmitted via any suitable means including memory sharing, message passing, token passing, network transmission, etc.

For a firmware and/or software implementation, the methodologies may be implemented with modules (e.g., procedures, functions, and so on) that perform the functions described herein. Any machine-readable medium tangibly embodying instructions may be used in implementing the methodologies described herein. For example, software codes may be stored in a memory. Memory may be implemented within the processor or external to the processor and may vary in implementation where the memory is employed in storing software codes for subsequent execution to that when the memory is employed in executing the software codes. As used herein the term "memory" refers to any type of long term, short term, volatile, nonvolatile, or other storage medium and is not to be limited to any particular type of memory or number of memories, or type of media upon which memory is stored.

Moreover, as disclosed herein, the term "storage medium" may represent one or more devices for storing data, including read only memory (ROM), random access memory (RAM), magnetic RAM, core memory, magnetic disk storage mediums, optical storage mediums, flash memory devices and/or other machine readable mediums for storing information. The term "machine-readable medium" includes, but is not limited to portable or fixed storage devices, optical storage devices, wireless channels and/or various other mediums capable of storing, containing or carrying instruction(s) and/or data.

The methodologies described herein are, in one or more embodiments, performable by a machine which includes one or more processors that accept code segments containing instructions. For any of the methods described herein, when the instructions are executed by the machine, the machine performs the method. Any machine capable of executing a set of instructions (sequential or otherwise) that specify actions to be taken by that machine are included. Thus, a typical machine may be exemplified by a typical processing system that includes one or more processors. Each processor may include one or more of a CPU, a graphics-processing unit, and a programmable DSP unit. The processing system further may include a memory subsystem including main RAM and/or a static RAM, and/or ROM. A bus subsystem may be included for communicating between the components. If the processing system requires a display, such a display may be included, e.g., a liquid crystal display (LCD). If manual data entry is required, the processing system also includes an input device such as one or more of an alphanumeric input unit such as a keyboard, a pointing control device such as a mouse, and so forth.

The memory includes machine-readable code segments (e.g. software or software code) including instructions for performing, when executed by the processing system, one of more of the methods described herein. The software may reside entirely in the memory, or may also reside, completely or at least partially, within the RAM and/or within the processor during execution thereof by the computer system. Thus, the memory and the processor also constitute a system comprising machine-readable code.

In alternative embodiments, the machine operates as a standalone device or may be connected, e.g., networked to other machines, in a networked deployment, the machine may operate in the capacity of a server or a client machine in server-client network environment, or as a peer machine in a peer-to-peer or distributed network environment. The machine may be, for example, a computer, a server, a cluster of servers, a cluster of computers, a web appliance, a distributed computing environment, a cloud computing environment, or any machine capable of executing a set of instructions (sequential or otherwise) that specify actions to be taken by that machine. The term "machine" may also be taken to include any collection of machines that individually or jointly execute a set (or multiple sets) of instructions to perform any one or more of the methodologies discussed herein.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A method of decoding comprising:
converting a data flow graph relating to a predetermined polar code to a tree graph comprising rate-zero nodes, rate-1 nodes, and rate-R nodes, each of the nodes linked to a root of the tree graph, the tree graph stored in a dual-port random-access memory (RAM);
replacing at least one rate-R node, associated with a sub-tree of the tree graph, with a single maximum likelihood node when predetermined conditions are met, by storing the single maximum likelihood node in the dual-port RAM; and
decoding the tree graph by sequentially visiting each of the nodes at the root.

2. The method according to claim 1, wherein
the tree graph is associated with a decoder implementing at least one of a pipelined successive cancellation architecture, a line successive cancellation architecture, a semi-parallel successive cancellation architecture, a simplified successive cancellation architecture, and a resource constrained successive cancellation architecture.

3. The method according to claim 1, wherein
the maximum likelihood node performs a resource constrained exhaustive search maximum likelihood decoding of a constituent code corresponding to a rate-R node it replaces.

4. The method according to claim 1, wherein
the tree graph is a binary tree.

5. The method according to claim 1, wherein
the predetermined condition is that $(2^{k_v}+1)(n_v-1) \leq P$, where P is the number of processing elements within a decoder executing the method;

$2^{k_v}$ is the number of candidate codewords; and $n_v$ is the length of the constituent codeword being decoded.

6. A polar code decoder comprising;

a plurality of memory elements, comprising a dual-port random-access memory (RAM), storing a tree graph generated from a data flow graph relating to a polar code being decoded, the tree graph comprising rate-zero nodes, rate-1 nodes, and rate-R nodes each linked to a root of the tree graph; and a plurality of processing elements configured for decoding the tree graph by:
  generating the tree graph from the data flow graph;
  replacing at least one rate-R node, associated with a sub-tree of the tree graph, with a single maximum likelihood node when predetermined conditions are met, by storing the single maximum likelihood node in the plurality of memory elements; and
  sequentially visiting each of the nodes to decode each of the nodes at the root.

7. The polar code decoder according to claim 6, wherein each decoder time step relating to the tree graph is associated with a clock cycle of a clock driving the polar code decoder.

8. The polar code decoder according to claim 6, wherein the single maximum likelihood node decodes a sub-tree of the tree graph in a single clock cycle.

9. The polar code decoder according to claim 6, wherein the predetermined condition is that $(2^{k_v}+1)(n_v-1) \leq P$, where P is the number of processing elements in the plurality of processing elements;

$2^{k_v}$ is the number of candidate codewords; and $n_v$ is the length of the constituent codeword being decoded.

* * * * *